(12) United States Patent
Lee et al.

(10) Patent No.: US 10,886,349 B2
(45) Date of Patent: Jan. 5, 2021

(54) DISPLAY DEVICE INCLUDING SHARED TRANSISTORS AMONG PIXELS

(71) Applicant: SAMSUNG DISPLAY CO., LTD., Yongin-si (KR)

(72) Inventors: Jeong-Soo Lee, Hwaseong-si (KR); Moo Soon Ko, Seoul (KR); Min Woo Woo, Seoul (KR); Ju-Won Yoon, Suwon-si (KR); Deuk Myung Ji, Hwaseong-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 140 days.

(21) Appl. No.: 16/058,392

(22) Filed: Aug. 8, 2018

(65) Prior Publication Data

US 2019/0088731 A1 Mar. 21, 2019

(30) Foreign Application Priority Data

Sep. 21, 2017 (KR) .......................... 10-2017-0121820

(51) Int. Cl.
*H01L 27/32* (2006.01)
*H01L 27/12* (2006.01)
(Continued)

(52) U.S. Cl.
CPC ....... *H01L 27/3262* (2013.01); *G09G 3/3233* (2013.01); *G09G 3/3258* (2013.01);
(Continued)

(58) Field of Classification Search
CPC .. G09G 3/3233; G09G 3/3258; G09G 3/3208; G09G 2300/0842;
(Continued)

(56) References Cited

U.S. PATENT DOCUMENTS

| 2013/0235021 A1* | 9/2013 | Maeda ................ G09G 3/3291 345/212 |
| 2015/0015468 A1* | 1/2015 | Ko ....................... G09G 3/3233 345/82 |

(Continued)

FOREIGN PATENT DOCUMENTS

| KR | 1020150045333 | 4/2015 |
| KR | 1020150079227 | 7/2015 |
| KR | 1020160027332 | 3/2016 |

*Primary Examiner* — Ryan A Lubit
(74) *Attorney, Agent, or Firm* — F. Chau & Associates, LLC

(57) ABSTRACT

A display device includes a plurality of pixels. Each pixel includes a first transistor including a first gate electrode, a first source region, and a first drain region, a second transistor connected to the first source region of the first transistor, a third transistor connected to the first gate electrode and the first drain region of the first transistor, a fifth transistor connected to the first source region of the first transistor, and a sixth transistor connected to the first drain region of the first transistor. The pixels include a first pixel and a second pixel disposed adjacent to each other. The first and second pixels share a fourth transistor connected to the third transistor of the first pixel and the third transistor of the second pixel, and share a seventh transistor connected to the sixth transistor of the first pixel and the sixth transistor of the second pixel.

25 Claims, 18 Drawing Sheets

(51) Int. Cl.
*H01L 29/786* (2006.01)
*G09G 3/3258* (2016.01)
*G09G 3/3233* (2016.01)

(52) U.S. Cl.
CPC ........ *H01L 27/124* (2013.01); *H01L 27/1214* (2013.01); *H01L 27/1255* (2013.01); *H01L 27/3276* (2013.01); *H01L 29/78696* (2013.01); *G09G 2300/0426* (2013.01); *G09G 2300/0809* (2013.01); *G09G 2300/0819* (2013.01); *G09G 2300/0842* (2013.01); *G09G 2310/0262* (2013.01); *G09G 2320/045* (2013.01); *H01L 27/3211* (2013.01); *H01L 27/3265* (2013.01)

(58) Field of Classification Search
CPC ... G09G 2300/0819; G09G 2300/0809; G09G 2300/0426
See application file for complete search history.

(56) References Cited

U.S. PATENT DOCUMENTS

| | | | |
|---|---|---|---|
| 2016/0064411 A1* | 3/2016 | Park | H01L 27/156 |
| | | | 257/89 |
| 2017/0132977 A1* | 5/2017 | Kim | G09G 3/3266 |
| 2017/0345373 A1* | 11/2017 | Kang | G09G 3/3258 |
| 2018/0247587 A1* | 8/2018 | Kimura | G09G 3/3233 |
| 2019/0259333 A1* | 8/2019 | Jinta | G09G 3/3233 |

* cited by examiner

DISPLAY DEVICE INCLUDING SHARED TRANSISTORS AMONG PIXELS

CROSS-REFERENCE TO RELATED APPLICATIONS

This application claims priority under 35 U.S.C. § 119 to Korean Patent Application No. 10-2017-0121820 filed on Sep. 21, 2017, the disclosure of which is incorporated by reference herein in its entirety.

TECHNICAL FIELD

The present disclosure relates to a display device.

DISCUSSION OF THE RELATED ART

An organic light emitting diode (OLED) display includes two electrodes and an organic emission layer interposed therebetween. Electrons injected from one electrode and holes injected from the other electrode are combined in the organic emission layer to generate excitons. The generated excitons are changed to a ground state from an exited state, releasing energy to emit light.

The organic light emitting diode display includes a plurality of pixels, each including an organic light emitting diode functioning as a self-emissive element. A plurality of transistors for driving the organic light emitting diode and at least one capacitor are formed in each pixel.

To increase the resolution of the organic light emitting diode display, an overall number of pixels may be increased by reducing an area of one pixel. In this case, there is a limit in regard to reducing the area of one pixel due to the area occupied by the plurality of thin film transistors and the capacitor included in one pixel.

SUMMARY

Exemplary embodiments provide a display device that is capable of having increased resolution by reducing the area of one pixel to increase the overall number of pixels.

A display device according to an exemplary embodiment includes a plurality of pixels. Each of the plurality of pixels includes a first transistor including a first gate electrode, a first source region, and a first drain region, a second transistor connected to the first source region of the first transistor, a third transistor connected to the first gate electrode and the first drain region of the first transistor, a fifth transistor connected to the first source region of the first transistor, and a sixth transistor connected to the first drain region of the first transistor. The plurality of pixels includes a first pixel and a second pixel disposed adjacent to each other. The first and second pixels share a fourth transistor connected to the third transistor of the first pixel and the third transistor of the second pixel, and share a seventh transistor connected to the sixth transistor of the first pixel and the sixth transistor of the second pixel.

In an exemplary embodiment, the display device further includes a first scan line connected to the second transistor and the third transistor of the first pixel, a second scan line connected to the fourth transistor and the seventh transistor of the first pixel and the second pixel, and a third scan line connected to the second transistor and the third transistor of the second pixel.

In an exemplary embodiment, the display device further includes an initialization voltage line connected to the fourth transistor and the seventh transistor of the first pixel and the second pixel.

In an exemplary embodiment, the fourth transistor of the first pixel and the second pixel includes a fourth gate electrode connected to the second scan line, a fourth source electrode connected to the initialization voltage line, and a fourth drain region connected to the first transistor and the third transistor.

In an exemplary embodiment, the seventh transistor of the first pixel and the second pixel includes a seventh gate electrode connected to the second scan line, a seventh source region connected to the sixth transistor, and a seventh drain region connected to the initialization voltage line.

In an exemplary embodiment, the display device further includes a connecting member connecting the first transistor of the first pixel and the third transistor of the first pixel.

In an exemplary embodiment, the third transistor of the first pixel includes a third gate electrode, a third source region, and a third drain region, and the connecting member connects the first gate electrode of the first transistor of the first pixel and the third drain region of the third transistor of the first pixel.

In an exemplary embodiment, third transistor of the first pixel and the fourth transistor of the first pixel and the second pixel are directly connected.

In an exemplary embodiment, the display device further includes a connecting member connecting the first transistor of the second pixel, the third transistor of the second pixel, and the fourth transistor of the first pixel and the second pixel.

In an exemplary embodiment, the third transistor of the second pixel includes a third gate electrode, a third source region, and a third drain region, and the connecting member connects the first gate electrode of the first transistor of the second pixel and the third drain region of the third transistor of the second pixel.

In an exemplary embodiment, the fourth transistor of the first pixel and the second pixel includes a fourth gate electrode, a fourth source region, and a fourth drain region, and the connecting member connects the third drain region of the third transistor of the second pixel and the fourth drain region of the fourth transistor of the first pixel and the second pixel.

In an exemplary embodiment, the display device further includes a connecting member connecting the sixth transistor of the first pixel, the sixth transistor of the second pixel, and the seventh transistor of the first pixel and the second pixel.

In an exemplary embodiment, the sixth transistor of the first pixel includes a sixth gate electrode, a sixth source region, and a sixth drain region, the seventh transistor of the first pixel and the second pixel includes a seventh gate electrode, a seventh source region, and a seventh drain region, and the connecting member connects the sixth drain region of the sixth transistor of the first pixel and the seventh source region of the seventh transistor of the first pixel and the second pixel.

In an exemplary embodiment, the sixth transistor of the second pixel includes a sixth gate electrode, a sixth source region, and a sixth drain region, and the connecting member connects the sixth drain region of the sixth transistor of the second pixel and the seventh source region of the seventh transistor of the first pixel and the second pixel.

In an exemplary embodiment, the first pixel and the second pixel are adjacent to each other in a first direction, and the plurality of pixels further includes a third pixel adjacent to the first pixel in a second direction, and a fourth pixel adjacent to the third pixel in the first direction. The second direction is different from the first direction.

In an exemplary embodiment, the second direction is substantially perpendicular to the first direction, and the fourth pixel is adjacent to the second pixel in the second direction.

In an exemplary embodiment, the display device further includes a driving voltage line disposed between the first pixel and the third pixel and between the second pixel and the fourth pixel. The fifth transistor of the first pixel, the fifth transistor of the second pixel, the fifth transistor of the third pixel, and the fifth transistor of the fourth pixel are connected to the driving voltage line.

In an exemplary embodiment, the display device further includes a first data line connected to the second transistor of the first pixel and the second transistor of the second pixel, and a second data line connected to the second transistor of the third pixel and the second transistor of the fourth pixel.

In an exemplary embodiment, the driving voltage line is disposed between the first data line and the second data line.

In an exemplary embodiment, the third pixel and the fourth pixel share a fourth transistor connected to the third transistor of the third pixel and the third transistor of the fourth pixel, and share a seventh transistor connected to the sixth transistor of the third pixel and the sixth transistor of the fourth pixel.

According to an exemplary embodiment, a display device includes a plurality of pixels. Each of the plurality of pixels includes a first transistor including a first gate electrode, a first source region, a first channel region, and a first drain region. The plurality of pixels includes a first pixel and a second pixel disposed adjacent to each other in a first direction, a third pixel disposed adjacent to the first pixel in a second direction, and a fourth pixel disposed adjacent to the second pixel in the second direction. The first direction and the second direction are different. The first channel region has a bent shape, the first channel region of the first pixel and the first channel region of the second pixel are symmetrical to each other, and the first channel region of the first pixel and the first channel region of the third pixel are symmetrical to each other.

In an exemplary embodiment, each of the plurality of pixels includes a second transistor connected to the first source region of the first transistor and including a second channel region, a third transistor connected to the first gate electrode and the first drain region of the first transistor and including a third channel region, a fifth transistor connected to the first source region of the first transistor and including a fifth channel region, and a sixth transistor connected to the first drain region of the first transistor and including a sixth channel region. The second channel region, the third channel region, the fifth channel region, and the sixth channel region of the first pixel and the second channel region, the third channel region, the fifth channel region, and the sixth channel region of the second pixel are symmetrical to each other. The second channel region, the third channel region, the fifth channel region, and the sixth channel region of the first pixel and the second channel region, the third channel region, the fifth channel region, and the sixth channel region of the third pixel are symmetrical to each other.

In an exemplary embodiment, the second direction is substantially perpendicular to the first direction, and the fourth pixel is adjacent to the second pixel in the second direction.

In an exemplary embodiment, the first channel region, the second channel region, the third channel region, the fifth channel region, and the sixth channel region of the fourth pixel and the first channel region, the second channel region, the third channel region, the fifth channel region, and the sixth channel region of the second pixel are symmetrical to each other.

In an exemplary embodiment, the first pixel and the second pixel include a fourth transistor connected to the third transistor of the first pixel and the third transistor of the second pixel, and a seventh transistor connected to the sixth transistor of the first pixel and the sixth transistor of the second pixel.

According to exemplary embodiments, by increasing the overall number of pixels by reducing the area of one pixel, the resolution of a display device may be increased.

BRIEF DESCRIPTION OF THE DRAWINGS

The above and other features will become more apparent by describing in detail exemplary embodiments thereof with reference to the accompanying drawings, in which.

DETAILED DESCRIPTION OF THE EXEMPLARY EMBODIMENTS

Figure 1:
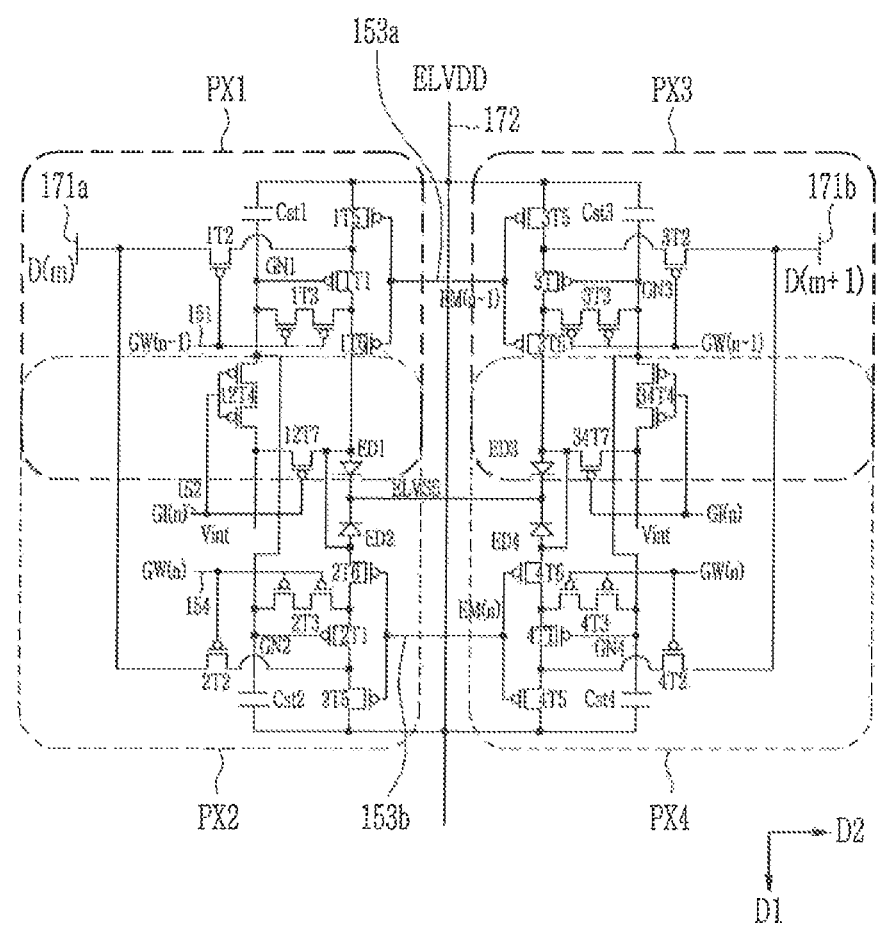
FIG. 1 is an equivalent circuit diagram of a plurality of pixels of a display device according to an exemplary embodiment.

Exemplary embodiments will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art.

Further, as described herein, the phrase "on a plane" means viewing the object portion from the top, and the phrase "on a cross-section" means viewing a cross-section of which the object portion is vertically cut from the side.

The display device according to an exemplary embodiment will be described with reference to FIGS. 1 to 5.

Figure 2:
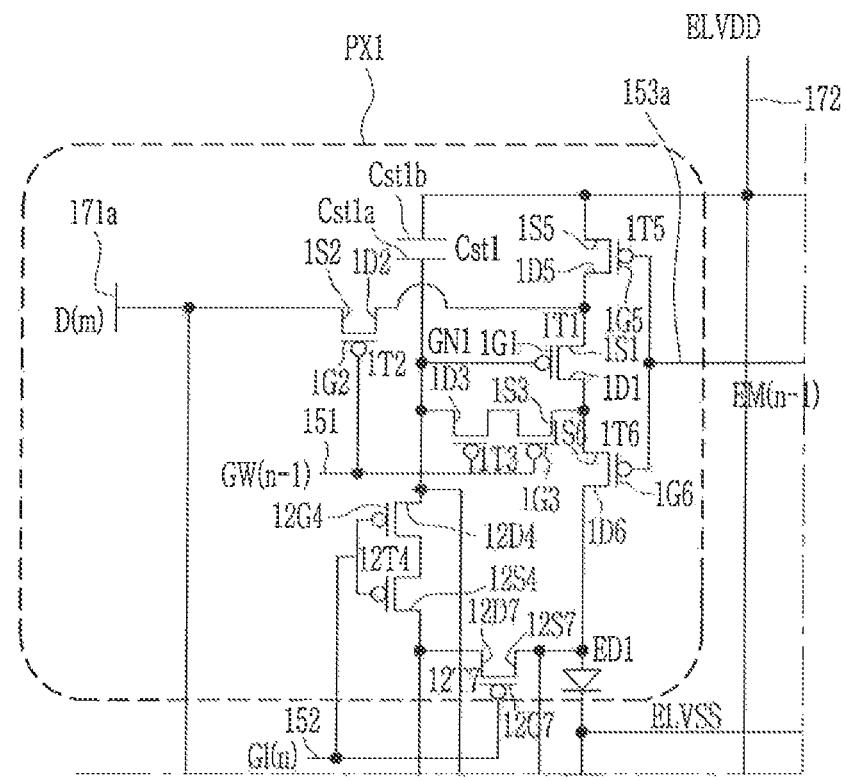
FIG. 2 is an equivalent circuit diagram of a first pixel from among a plurality of pixels of a display device according to an exemplary embodiment.
Figure 3:
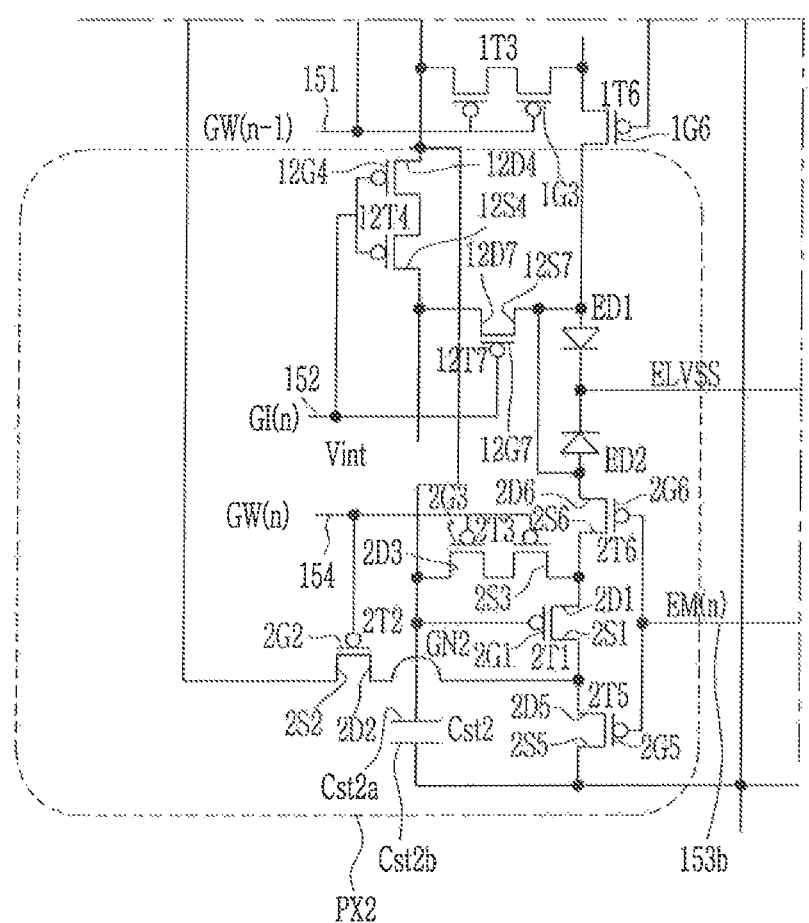
FIG. 3 is an equivalent circuit diagram of a second pixel from among a plurality of pixels of a display device according to an exemplary embodiment.
Figure 4:
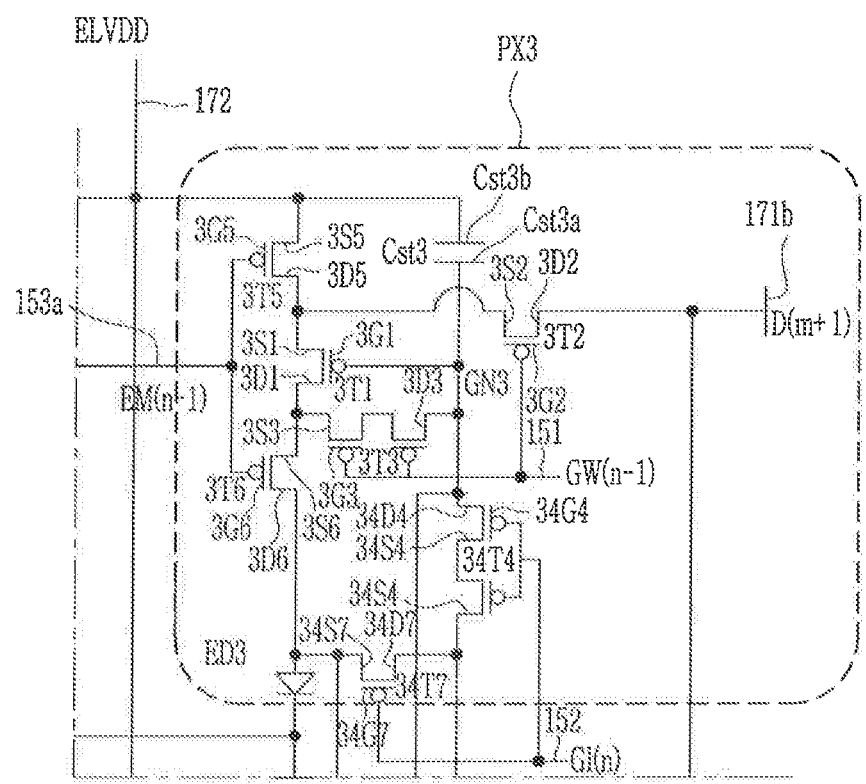
FIG. 4 is an equivalent circuit diagram of a third pixel from among a plurality of pixels of a display device according to an exemplary embodiment.
Figure 5:
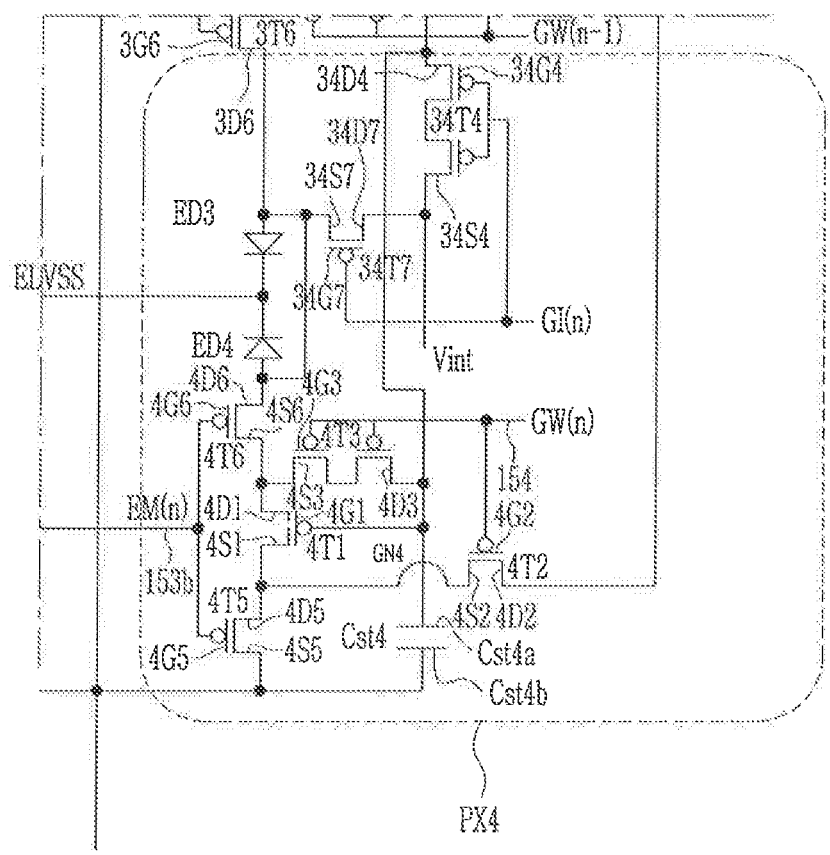
FIG. 5 is an equivalent circuit diagram of a fourth pixel from among a plurality of pixels of a display device according to an exemplary embodiment.

FIG. 1 is an equivalent circuit diagram of a plurality of pixels of a display device according to an exemplary embodiment. FIG. 1 shows the equivalent circuit diagram of four pixels adjacent to each other. FIG. 2 is an equivalent circuit diagram of a first pixel from among a plurality of pixels of a display device according to an exemplary embodiment. FIG. 3 is an equivalent circuit diagram of a second pixel from among a plurality of pixels of a display device according to an exemplary embodiment. FIG. 4 is an equivalent circuit diagram of a third pixel from among a plurality of pixels of a display device according to an exemplary embodiment. FIG. 5 is an equivalent circuit diagram of a fourth pixel from among a plurality of pixels of a display device according to an exemplary embodiment. FIG. 1 shows first to fourth pixels shown in FIGS. 2 to 5 together.

As shown in FIGS. 1 to 5, the display device according to an exemplary embodiment includes a plurality of pixels PX1, PX2, PX3, and PX4 and a plurality of signal lines 151, 152, 153a, 153b, 154, 171a, 171b, and 172 for displaying an image according to an image signal. Each of the plurality of pixels PX1, PX2, PX3, and PX4 includes first transistors 1T1, 2T1, 3T1, and 4T1, second transistors 1T2, 2T2, 3T2, and 4T2, third transistors 1T3, 2T3, 3T3, and 4T3, fifth transistors 1T5, 2T5, 3T5, and 4T5, and sixth transistors 1T6, 2T6, 3T6, and 4T6. Also, each of the plurality of pixels PX1, PX2, PX3, and PX4 may include capacitors Cst1, Cst2, Cst3, and Cst4 and at least one light emitting diode (LED) ED1, ED2, ED3, and ED4. In the present exemplary embodiment, an example in which each of the pixels PX1, PX2, PX3, and PX4 includes one of the light emitting diodes (LED) ED1, ED2, ED3, and ED4 is described.

The plurality of pixels PX1, PX2, PX3, and PX4 may include a first pixel PX1, a second pixel PX2, a third pixel PX3, and a fourth pixel PX4. The first pixel PX1 and the second pixel PX2 may be adjacent to each other in a first direction D1, and the third pixel PX3 and the fourth pixel PX4 may be adjacent to each other in a first direction D1. For example, in exemplary embodiments, the first and second pixels PX1 and PX2 are adjacent to each other in the first direction D1 with no intervening pixels disposed therebetween (e.g., the first and second pixels PX1 and PX2 are disposed directly adjacent to each other in the first direction D1), and the third and fourth pixels PX3 and PX4 are adjacent to each other in the first direction D1 with no intervening pixels disposed therebetween (e.g., the third and fourth pixels PX3 and PX4 are disposed directly adjacent to each other in the first direction D1). The first pixel PX1 and the third pixel PX3 may be adjacent to each other in a second direction D2, and the second pixel PX2 and the fourth pixel PX4 may be adjacent to each other in the second direction D2. For example, in exemplary embodiments, the first and third pixels PX1 and PX3 are adjacent to each other in the second direction D2 with no intervening pixels disposed therebetween (e.g., the first and third pixels PX1 and PX3 are disposed directly adjacent to each other in the second direction D2), and the second and fourth pixels PX2 and PX4 are adjacent to each other in the second direction D2 with no intervening pixels disposed therebetween (e.g., the second and fourth pixels PX2 and PX4 are disposed directly adjacent to each other in the second direction D2). The first direction D1 and the second direction D2 are different from each other, and the second direction D2 may be substantially perpendicular to the first direction D1. For example, the first direction D1 may be a horizontal direction, and the second direction D2 may be a vertical direction crossing the first direction D1.

The first pixel PX1 and the second pixel PX2 include the fourth transistor 12T4 and the seventh transistor 12T7 to be shared. That is, each of the first pixel PX1 and the second pixel PX2 does not include its own fourth transistor 12T4. Rather, the first pixel PX1 and the second pixel PX2 share the fourth transistor 12T4. Similarly, each of the first pixel PX1 and the second pixel PX2 does not include its own seventh transistor 12T7. Rather, the first pixel PX1 and the second pixel PX2 share the seventh transistor 12T7. The third pixel PX3 and the fourth pixel PX4 include the fourth transistor 34T4 and the seventh transistor 34T7 to be shared. That is, each of the third pixel PX3 and the fourth pixel PX4 does not include its own fourth transistor 34T4. Rather, the third pixel PX3 and the fourth pixel PX4 share the fourth transistor 34T4. Similarly, each of the third pixel PX3 and the fourth pixel PX4 does not include its own seventh transistor 34T7. Rather, the third pixel PX3 and the fourth pixel PX4 share the seventh transistor 34T7.

That is, the first transistors 1T1, 2T1, 3T1, and 4T1, the second transistors 1T2, 2T2, 3T2, and 4T2, the third transistors 1T3, 2T3, 3T3, and 4T3, the fifth transistors 1T5, 2T5, 3T5, and 4T5, and the sixth transistors 1T6, 2T6, 3T6, and 4T6 are included in each of the pixels PX1, PX2, PX3, and PX4. One of the fourth transistors 12T4 and 34T4 and the seventh transistors 12T7 and 34T7 is formed for two adjacent pixels of PX1, PX2, PX3, and PX4, and two adjacent pixels of PX1, PX2, PX3, and PX4 share the fourth transistors 12T4 and 34T4 and the seventh transistors 12T7 and 34T7.

In this way, in the present exemplary embodiment, each of the pixels PX1, PX2, PX3, and PX4 is driven using the seven transistors and one capacitor. Seven transistors are not all formed in each of the pixels PX1, PX2, PX3, and PX4. Rather, according to an exemplary embodiment, five transistors are formed for each of the pixels PX1, PX2, PX3, and PX4, and two adjacent pixels from among pixels PX1, PX2, PX3, and PX4 share two transistors.

Accordingly, there is an effect that each of the pixels PX1, PX2, PX3, and PX4 substantially includes six transistors and one capacitor. Accordingly, the area occupied by the transistors may be reduced, and the area of one pixel may be reduced, and accordingly, the resolution may increase by increasing the overall number of pixels.

The signal lines 151, 152, 153a, 153b, 154, 171a, 171b, and 172 may include a plurality of scan lines 151, 152, and 154, a plurality of control lines 153a and 153b, a plurality of data lines 171a and 171b, and a driving voltage line 172.

The plurality of scan lines 151, 152, and 154 may transmit scan signals GW(n−1), GI(n), and GW(n), respectively. The scan signals GW(n−1), GI(n), and GW(n) may transmit a gate-on voltage and a gate-off voltage for turning-on/turning-off the second transistors 1T2, 2T2, 3T2, and 4T2, the third transistors 1T3, 2T3, 3T3, and 4T3, the fourth transistors 12T4 and 34T4, and the seventh transistors 12T7 and 34T7.

The scan lines 151, 152, and 154 include a first scan line 151 for transmitting the first scan signal GW(n−1), a second scan line 152 for transmitting the second scan signal GI(n), and a third scan line 154 for transmitting the third scan signal GW(n). The first scan signal GW(n−1), the second scan signal GI(n), and the third scan signal GW(n) may have gate-on voltages applied at different times. For example, when the first scan signal GW(n−1) is an n-th scan signal (n is a natural number of 1 or more) among the scan signals applied during one frame, the second scan signal GI(n) may be a previous scan signal such as an (n−1)-th scan signal, and the third scan signal GW(n) may be a next scan signal such as an (n+1)-th scan signal.

The first scan line 151 is connected to the second transistor 1T2 of the first pixel PX1, the third transistor 1T3 of the first pixel PX1, the second transistor 3T2 of the third pixel PX3, and the third transistor 3T3 of the third pixel PX3. The second scan line 152 is connected to the fourth transistor 12T4 shared between the first pixel PX1 and the second pixel PX2, the seventh transistor 12T7 shared between the first pixel PX1 and the second pixel PX2, the fourth transistor 34T4 shared between the third pixel PX3 and the fourth pixel PX4, and the seventh transistor 34T7 shared between the third pixel PX3 and the fourth pixel PX4. The third scan line 154 is connected to the second transistor 2T2 of the second pixel PX2, the third transistor 2T3 of the second pixel PX2, the second transistor 4T2 of the fourth pixel PX4, and the third transistor 4T3 of the fourth pixel PX4. In an exemplary embodiment, the third transistor 1T3 of the first pixel PX1 and the fourth transistor 12T4 of the first pixel PX1 and the second pixel PX2 are directly connected.

The control lines 153a and 153b may transmit control signals EM(n−1) and EM(n), and particularly may transmit a light emitting control signal controlling the emission of the light emitting diodes (LED) ED1, ED2, ED3, and ED4 included in the pixels PX1, PX2, PX3, and PX4. The control signal transmitted by the control lines 153a and 153b may be the gate-on voltage and the gate-off voltage, and may have a different waveform from the scan signal transmitted by the scan lines 151, 152, and 154.

The control lines 153a and 153b may include a first control line 153a and a second control line 153b. The first control line 153a is connected to the fifth transistor 1T5 of the first pixel PX1, the sixth transistor 1T6 of the first pixel PX1, the fifth transistor 3T5 of the third pixel PX3, and the sixth transistor 3T6 of the third pixel PX3. The second control line 153b is connected to the fifth transistor 2T5 of the second pixel PX2, the sixth transistor 2T6 of the second pixel PX2, the fifth transistor 4T5 of the fourth pixel PX4, and the sixth transistor 4T6 of the fourth pixel PX4.

The data lines 171a and 171b may transmit data signals Dm and D(m+1), and the driving voltage line 172 may transmit a driving voltage ELVDD. The data signals D(m) and D(m+1) may have various voltage levels depending on the image signal input to the display device, and the driving voltage ELVDD may have a substantially constant level.

The data lines 171a and 171b may include a first data line 171a and a second data line 171b. The first data line 171a is connected to the second transistor 1T2 of the first pixel PX1 and the second transistor 2T2 of the second pixel PX2. The second data line 171b is connected to the second transistor 3T2 of the third pixel PX3 and the second transistor 4T2 of the fourth pixel PX4.

Gate electrodes 1G1, 2G1, 3G1, and 4G1 of the first transistors 1T1, 2T1, 3T1, and 4T1 of each of the pixels PX1, PX2, PX3, and PX4 are connected to one end Cst1a, Cst2a, Cst3a and Cst4a of the capacitors Cst1, Cst2, Cst3, and Cst4 through driving gate nodes GN1, GN2, GN3, and GN4. Source electrodes 1S1, 2S1, 3S1, and 4S1 of the first transistors 1T1, 2T1, 3T1, and 4T1 of each of the pixels PX1, PX2, PX3, and PX4 are connected to the driving voltage line 172 via the fifth transistors 1T5, 2T5, 3T5, and 4T5. Drain electrodes 1D1, 2D1, 3D1, and 4D1 of the first transistors 1T1, 2T1, 3T1, and 4T1 of each of the pixels PX1, PX2, PX3, and PX4 are electrically connected to anodes of the light emitting diodes (LED) ED1, ED2, ED3, and ED4 via the sixth transistors 1T6, 2T6, 3T6, and 4T6. The first transistors 1T1, 2T1, 3T1, and 4T1 of each of the pixels PX1, PX2, PX3, and PX4 receive the data signals D(m) and D(m+1) transmitted by the data lines 171a and 171b depending on the switching operation of the second transistors 1T2, 2T2, 3T2, and 4T2 to supply the driving current Id to the light emitting diodes (LED) ED1, ED2, ED3, and ED4.

The gate electrodes 1G2 and 3G2 of the second transistors 1T2 and 3T2 of the first and third pixels PX1 and PX3 are connected to the first scan line 151. The source electrode 1S2 of the second transistor 1T2 of the first pixel PX1 is connected to the first data line 171a, and the drain electrode 1D2 of the second transistor 1T2 of the first pixel PX1 is connected to the driving voltage line 172 via the fifth transistor 1T5 while being connected to the source electrode 1S1 of the first transistor 1T1. The second transistor 1T2 of the first pixel PX1 is turned on depending on the first scan signal GW(n−1) transmitted through the first scan line 151, thereby transmitting the first data signal D(m) transmitted from the first data line 171a to the source electrode 1S1 of the first transistor 1T1. The source electrode 3S2 of the second transistor 3T2 of the third pixel PX1 is connected to the second data line 171b, and the drain electrode 3D2 of the second transistor 3T2 of the third pixel PX3 is connected to the driving voltage line 172 via the fifth transistor 3T5 while being connected to the source electrode 3S1 of the first transistor 3T1. The second transistor 3T2 of the third pixel PX3 is turned on depending on the first scan signal GW(n−1) transmitted through the first scan line 151, thereby transmitting the second data signal D(m+1) transmitted from the second data line 171b to the source electrode 3S1 of the first transistor 3T1.

The gate electrodes 2G2 and 4G2 of the second transistors 2T2 and 4T2 of the second and fourth pixels PX2 and PX4 are connected to the third scan line 154. The source electrode 2S2 of the second transistor 2T2 of the second pixel PX2 is connected to the first data line 171a. The drain electrode 2D2 of the second transistor 1T2 of the second pixel PX2 is connected to the driving voltage line 172 via the fifth transistor 2T5 while being connected to the source electrode 2S1 of the first transistor 2T1. The second transistor 2T2 of the second pixel PX2 is turned on depending on the third scan signal GW(n) transmitted through the third scan line 154, thereby transmitting the first data signal D(m) transmitted from the first data line 171a to the source electrode 2S1 of the first transistor 2T1. The source electrode 4S2 of the second transistor 4T2 of the fourth pixel PX4 is connected to the second data line 171b. The drain electrode 4D2 of the second transistor 4T2 of the fourth pixel PX4 is connected to the driving voltage line 172 via the fifth transistor 4T5 while being connected to the source electrode 4S1 of the first transistor 4T1. The second transistor 4T2 of the fourth pixel PX4 is turned on depending on the third scan signal GW(n) transmitted through the third scan line 154, thereby transmitting the second data signal D(m+1) transmitted from the second data line 171b to the source electrode 4S1 of the first transistor 4T1.

The gate electrodes 1G3 and 3G3 of the third transistors 1T3 and 3T3 of the first and third pixels PX1 and PX3 are connected to the first scan line 151. The source electrode 1S3 of the third transistor 1T3 of the first pixel PX1 is connected to the anode of the light emitting diode (LED) ED1 via the sixth transistor 1T6 while being connected to the drain electrode 1D1 of the first transistor 1T1. The drain electrode 1D3 of the third transistor 1T3 of the first pixel PX1 is connected to the drain electrode 12D4 of the fourth transistor 12T4 shared between the first and second pixels PX1 and PX2, one end Cst1a of the capacitor Cst1, and the gate electrode 1G1 of the first transistor 1T1. The third transistor 1T3 of the first pixel PX1 is turned on depending on the scan signal GW(n−1) transmitted through the first scan line 151 to connect the gate electrode 1G1 and the drain electrode 1D1 of the first transistor 1T1, thereby diode-connecting the first transistor 1T1. The source electrode 3S3 of the third transistor 3T3 of the third pixel PX3 is connected to the anode of the light emitting diode (LED) ED3 via the sixth transistor 3T6 while being connected to the drain electrode 3D1 of the first transistor 3T1. The drain electrode 3D3 of the third transistor 3T3 of the third pixel PX3 is connected to the drain electrode 34D4 of the fourth transistor 34T4 shared between the third and fourth pixels PX3 and PX4, one end Cst3a of the capacitor Cst3, and the gate electrode 3G1 of the first transistor 3T1. The third transistor 3T3 of the third pixel PX3 is turned on depending on the scan signal GW(n−1) of the first scan line 151 to connect the gate electrode 3G1 and the drain electrode 3D1 of the first transistor 3T1, thereby diode-connecting the first transistor 3T1.

The gate electrodes 2G3 and 4G3 of the third transistors 2T3 and 4T3 of the second and fourth pixels PX2 and PX4 are connected to the third scan line 154. The source electrode 2S3 of the third transistor 2T3 of the second pixel PX2 is connected to the anode of the light emitting diode (LED) ED2 via the sixth transistor 2T6 while being connected to the drain electrode 2D1 of the first transistor 2T1. The drain electrode 2D3 of the third transistor 2T3 of the second pixel PX2 is connected to the drain electrode 12D4 of the fourth transistor 12T4 shared between the first and second pixels PX1 and PX2, one end Cst2a of the capacitor Cst2, and the gate electrode 2G1 of the first transistor 2T1. The third transistor 2T3 of the second pixel PX2 is turned on depending on the scan signal GW(n) transmitted through the third scan line 154 to connect the gate electrode 2G1 and the drain electrode 2D1 of the first transistor 2T1, thereby diode-connecting the first transistor 2T1. The source electrode 4S3 of the third transistor 4T3 of the fourth pixel PX4 is connected to the anode of the light emitting diode (LED) ED4 via the sixth transistor 4T6 while being connected to the drain electrode 4D1 of the first transistor 4T1. The drain electrode 4D3 of the third transistor 4T3 of the fourth pixel PX4 is connected to the drain electrode 34D4 of the fourth transistor 34T4 shared between the third and fourth pixels PX3 and PX4, one end Cst4a of the capacitor Cst4, and the gate electrode 4G1 of the first transistor 4T1. The third transistor 4T3 of the fourth pixel PX4 is turned on depending on the scan signal GW(n) transmitted through the third scan line 154 to connect the gate electrode 4G1 and the drain electrode 4D1 of the first transistor 4T1, thereby diode-connecting the first transistor 4T1.

The gate electrode 12G4 of the fourth transistor 12T4 shared between the first and second pixels PX1 and PX2 is connected to the second scan line 152. The source electrode 12S4 of the fourth transistor 12T4 shared between the first and second pixels PX1 and PX2 is connected to an initialization voltage (Vint) terminal. The drain electrode 12D4 of the fourth transistor 12T4 shared between the first and second pixels PX1 and PX2 is connected to ends Cst1a and Cst2a of the capacitors Cst1 and Cst2 and the gate electrodes 1G1 and 2G1 of the first transistors 1T1 and 2T1 through the drain electrodes 1D3 and 2D3 of the third transistors 1T3 and 2T3 of the first and second pixels PX1 and PX2. The fourth transistor 12T4 shared between the first and second pixels PX1 and PX2 is turned on depending on the second scan signal GI(n) transmitted through the second scan line 152 to transmit the initialization voltage Vint to the gate electrodes 1G1 and 2G1 of the first transistors 1T1 and 2T1 of the first and second pixels PX1 and PX2, thereby performing an initialization operation of initializing the voltage of the gate electrodes 1G1 and 2G1 of the first transistors 1T1 and 2T1.

The gate electrode 34G4 of the fourth transistor 34T4 shared between the third and fourth pixels PX3 and PX4 is connected to the second scan line 152. The source electrode 34S4 of the fourth transistor 34T4 shared between the third and fourth pixels PX3 and PX4 is connected to the initialization voltage Vint terminal. The drain electrode 34D4 of the fourth transistor 34T4 of the third and fourth pixels PX3 and PX4 shared between the third and fourth pixels PX3 and PX4 is connected to ends Cst3a and Cst4a of the capacitors Cst3 and Cst4 and the gate electrodes 3G1 and 4G1 of the first transistors 3T1 and 4T1 through the drain electrodes 3D3 and 4D3 of the third transistors 3T3 and 4T3. The fourth transistor 34T4 shared between the third and fourth pixels PX3 and PX4 is turned on depending on the second scan signal GI(n) transmitted to the second scan line 152 to transmit the initialization voltage Vint to the gate electrodes 3G1 and 4G1 of the first transistors 3T1 and 4T1 of the third and fourth pixels PX3 and PX4, thereby executing the initialization operation of initializing the voltage of the gate electrodes 3G1 and 4G1 of the first transistors 3T1 and 4T1.

The gate electrodes 1G5 and 3G5 of the fifth transistors 1T5 and 3T5 of the first and third pixels PX1 and PX3 are connected to the first control line 153a, and the source electrodes 1S5 and 3S5 of the fifth transistors 1T5 and 3T5 of the first and third pixels PX1 and PX3 are connected to the driving voltage line 172. The drain electrode 1D5 of the fifth transistor 1T5 of the first pixel PX1 is connected to the source electrode 1S1 of the first transistor 1T1 and the drain electrode 1D2 of the second transistor 1T2. The drain electrode 3D5 of the fifth transistor 3T5 of the third pixel PX3 is connected to the source electrode 3S1 of the first transistor 3T1 and the drain electrode 3D2 of the second transistor 3T2.

The gate electrodes 2G5 and 4G5 of the fifth transistors 2T5 and 4T5 of the second and fourth pixels PX2 and PX4 are connected to the second control line 153b, and the source electrodes 2S5 and 4S5 of the fifth transistors 2T5 and 4T5 of the second and fourth pixels PX2 and PX4 are connected to the driving voltage line 172. The drain electrode 2D5 of the fifth transistor 2T5 of the second pixel PX2 is connected to the source electrode 2S1 of the first transistor 2T1 and the drain electrode 2D2 of the second transistor 2T2. The drain electrode 4D5 of the fifth transistor 4T5 of the fourth pixel PX4 is connected to the source electrode 4S1 of the first transistor 4T1 and the drain electrode 4D2 of the second transistor 4T2.

The gate electrodes 1G6 and 3G6 of the sixth transistors 1T6 and 3T6 of the first and third pixels PX1 and PX3 are connected to the first control line 153a. The source electrode 1S6 of the sixth transistor 1T6 of the first pixel PX1 is connected to the drain electrode 1D1 of the first transistor 1T1 and the source electrode 1S3 of the third transistor 1T3. The drain electrode 1D6 of the sixth transistor 1T6 of the first pixel PX1 is connected to the anode of the light emitting diode (LED) ED1. The fifth transistor 1T5 and the sixth transistor 1T6 of the first pixel PX1 are simultaneously turned on depending on the light emission control signal EM(n−1) transmitted through the first control line 153a. As a result, the driving voltage ELVDD may be compensated through the diode-connected first transistor 1T1 and then may be transmitted to the light emitting diode (LED) ED1. The source electrode 3S6 of the sixth transistor 3T6 of the third pixel PX3 is connected to the drain electrode 3D1 of the first transistor 3T1 and the source electrode 3S3 of the third transistor 3T3. The drain electrode 3D6 of the sixth transistor 3T6 of the third pixel PX3 is connected to the anode of the light emitting diode (LED) ED3. The fifth transistor 3T5 and the sixth transistor 3T6 of the third pixel PX3 are simultaneously turned on depending on the light emission control signal EM(n−1) transmitted through the first control line 153a. As a result, the driving voltage ELVDD is compensated through the diode-connected first transistor 3T1 and may be transmitted to the light emitting diode (LED) ED3.

The gate electrodes 2G6 and 4G6 of the sixth transistors 2T6 and 4T6 of the second and fourth pixels PX2 and PX4 are connected to the second control line 153b. The source electrode 2S6 of the sixth transistor 2T6 of the second pixel PX2 is connected to the drain electrode 2D1 of the first transistor 2T1 and the source electrode 2S3 of the third transistor 2T3. The drain electrode 2D6 of the sixth transistor 2T6 of the second pixel PX2 is connected to the anode of the light emitting diode (LED) ED2. The fifth transistor 2T5 and the sixth transistor 2T6 of the second pixel PX2 are simultaneously turned on depending on the light emission control signal EM(n) transmitted through the second control line 153b. As a result, the driving voltage ELVDD is compensated through the diode-connected first transistor 2T1 and may be transmitted to the light emitting diode (LED) ED2. The source electrode 4S6 of the sixth transistor 4T6 of the fourth pixel PX4 is connected to the drain electrode 4D1 of the first transistor 4T1 and the source electrode 4S3 of the third transistor 4T3. The drain electrode 4D6 of the sixth transistor 4T6 of the fourth pixel PX4 is connected to the anode of the light emitting diode (LED) ED4. The fifth transistor 4T5 and the sixth transistor 4T6 of the fourth pixel PX4 are simultaneously turned on depending on the light emission control signal EM(n) transmitted through the second control line 153b. As a result, the driving voltage ELVDD is compensated through the diode-connected first transistor 4T1 and may be transmitted to the light emitting diode (LED) ED4.

The gate electrode 12G7 of the seventh transistor 12T7 shared between the first and second pixels PX1 and PX2 is connected to the second scan line 152. The source electrode 12S7 of the seventh transistor 12T7 shared between the first and second pixels PX1 and PX2 is connected to the drain electrodes 1D6 and 2D6 of the sixth transistors 1T6 and 2T6 of the first and second pixels PX1 and PX2 and the anode of the light emitting diodes (LED) ED1 and ED2 of the first and second pixels PX1 and PX2. The drain electrode 12D7 of the seventh transistor 12T7 shared between the first and second pixels PX1 and PX2 is connected to the initialization voltage Vint terminal and the fourth transistor 12T4 shared between the first and second pixels PX1 and PX2.

The gate electrode 34G7 of the seventh transistor 34T7 shared between the third and fourth pixels PX3 and PX4 is connected to the second scan line 152. The source electrode 34S7 of the seventh transistor 34T7 shared between the third and fourth pixels PX3 and PX4 is connected to the drain electrodes 3D6 and 4D6 of the sixth transistors 3T6 and 4T6 of the third and fourth pixels PX3 and PX4 and the anodes of the light emitting diodes (LED) ED3 and ED4 of the third and fourth pixels PX3 and PX4. The drain electrode 34D7 of the seventh transistor 34T7 shared between the third and fourth pixels PX3 and PX4 is connected to the initialization voltage Vint terminal and the fourth transistor 34T4 shared between the third and fourth pixels PX3 and PX4.

Each of the transistors 1T1, 2T1, 3T1, 4T1, 1T2, 2T2, 3T2, 4T2, 1T3, 2T3, 3T3, 4T3, 12T4, 34T4, 1T5, 2T5, 3T5, 4T5, 1T6, 2T6, 3T6, 4T6, 12T7, and 34T7 of each of the pixels PX1, PX2, PX3, and PX4 may be a P-type channel transistor such as a p-type metal-oxide-semiconductor (PMOS) transistor. However, exemplary embodiments are not limited thereto. For example, in exemplary embodiments, at least one of the transistors 1T1, 2T1, 3T1, 4T1, 1T2, 2T2, 3T2, 4T2, 1T3, 2T3, 3T3, 4T3, 12T4, 34T4, 1T5, 2T5, 3T5, 4T5, 1T6, 2T6, 3T6, 4T6, 12T7, and 34T7 may be an N-type channel transistor such as an n-type metal-oxide-semiconductor (NMOS) transistor.

One end Cst1a, Cst2a, Cst3a and Cst4a of the capacitors Cst1, Cst2, Cst3, and Cst4 of each of the pixels PX1, PX2, PX3, and PX4 is connected to the gate electrodes 1G1, 2G1, 3G1, and 4G1 of the first transistors 1T1, 2T1, 3T1, and 4T1 of each of the pixels PX1, PX2, PX3, and PX4. The other end Cst1b, Cst2b, Cst3b, and Cst4b of the capacitors Cst1, Cst2, Cst3, and Cst4 of each of the pixels PX1, PX2, PX3, and PX4 is connected to the driving voltage line 172. The cathodes of the light emitting diodes (LED) ED1, ED2, ED3, and ED4 of each other pixels PX1, PX2, PX3, and PX4 are connected to the common voltage ELVSS terminal transmitting the common voltage ELVSS, thereby receiving the common voltage ELVSS.

It is to be understood that the structure of the pixels PX1, PX2, PX3, and PX4 according to exemplary embodiments is not limited to the structure shown in FIG. 4. For example, in exemplary embodiments, the number of the transistors and the number of the capacitors included in each of the pixels PX1, PX2, PX3, and PX4 and the connection relationship thereof may be variously changed.

The structure of a partial region of the display device according to an exemplary embodiment will be described in detail with reference to FIGS. 6 to 17, as well as with reference to the above description made with reference to FIGS. 1 to 5.

For convenience of explanation, a plane structure of the display device according to an exemplary embodiment will be described first, and then a cross-sectional structure of the display device will be described.

Figure 6:
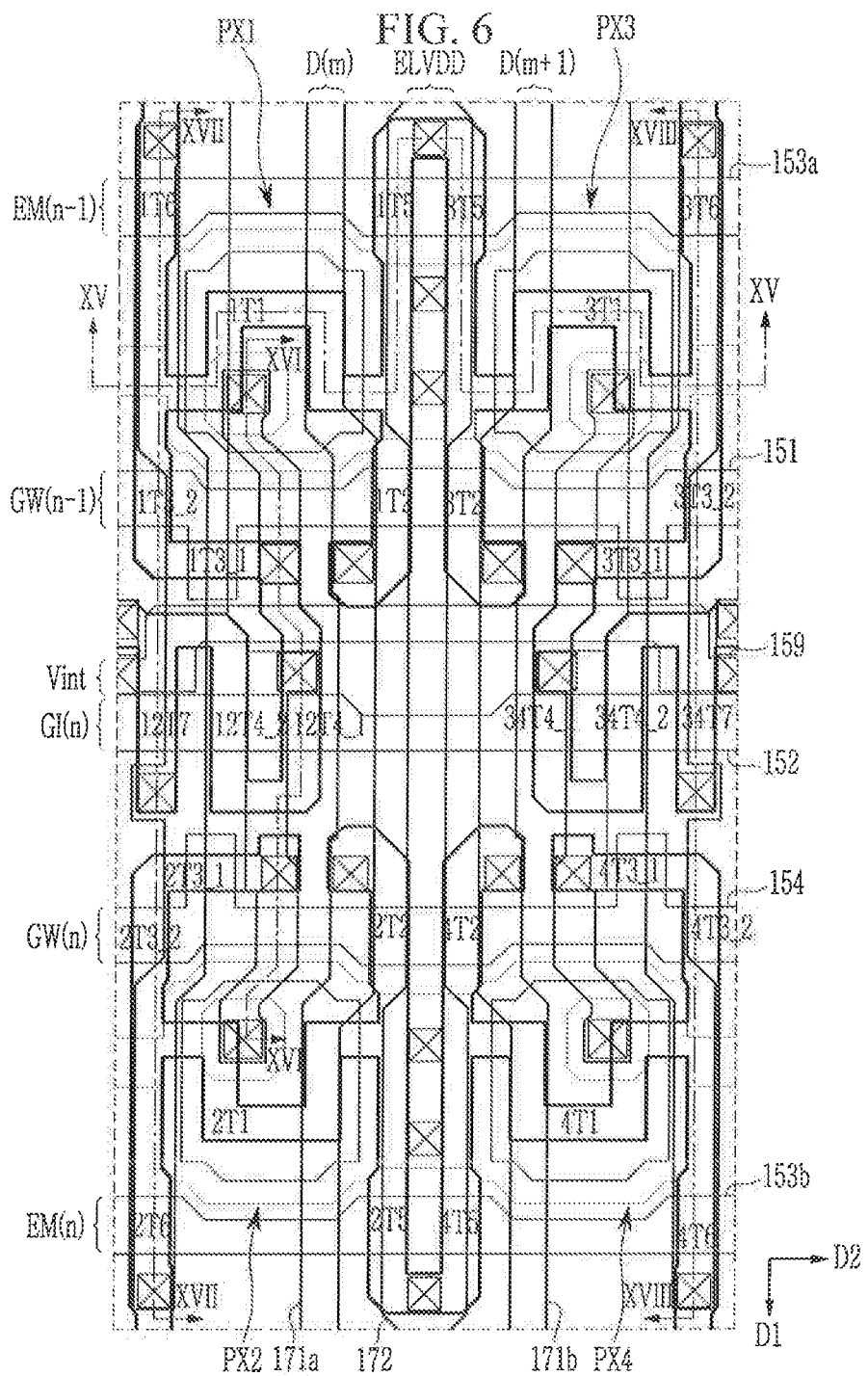
FIG. 6 is a top plan view showing a plurality of pixels disposed adjacent to each other in a display device according to an exemplary embodiment.
Figure 7:
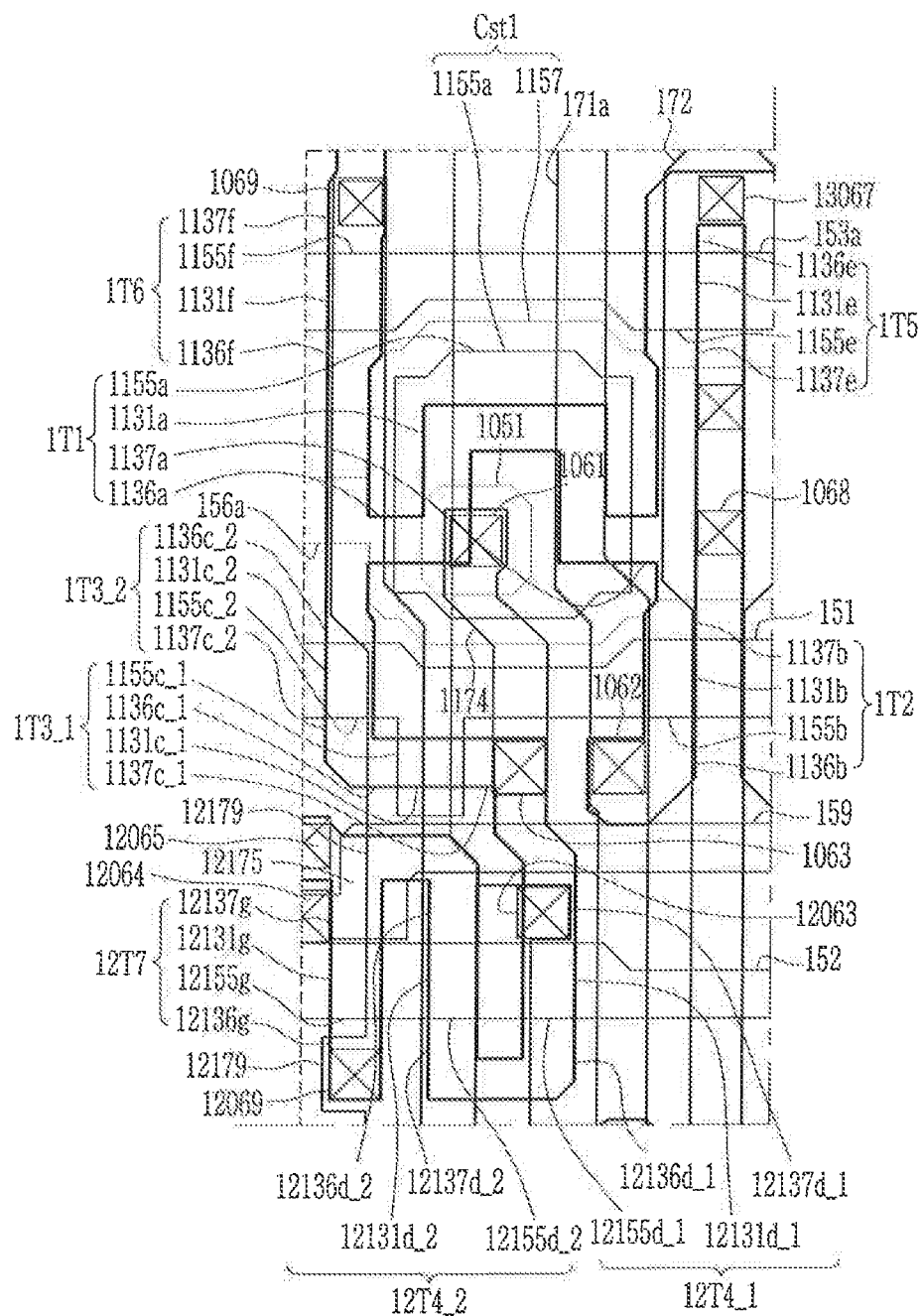
FIG. 7 is a top plan view showing a first pixel from among a plurality of pixels of FIG. 6 according to an exemplary embodiment.
Figure 8:
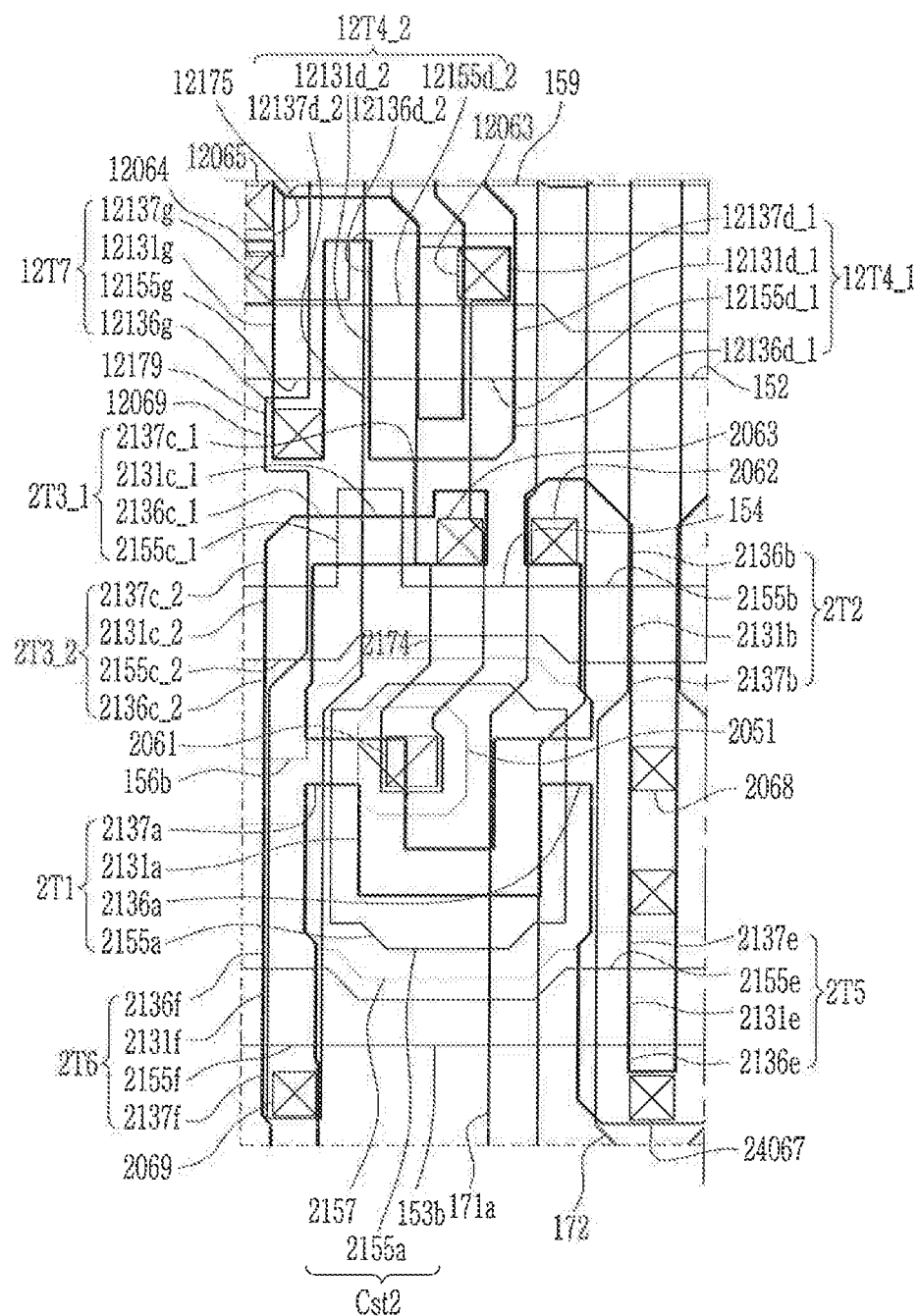
FIG. 8 is a top plan view showing a second pixel from among a plurality of pixels of FIG. 6 according to an exemplary embodiment.
Figure 9:
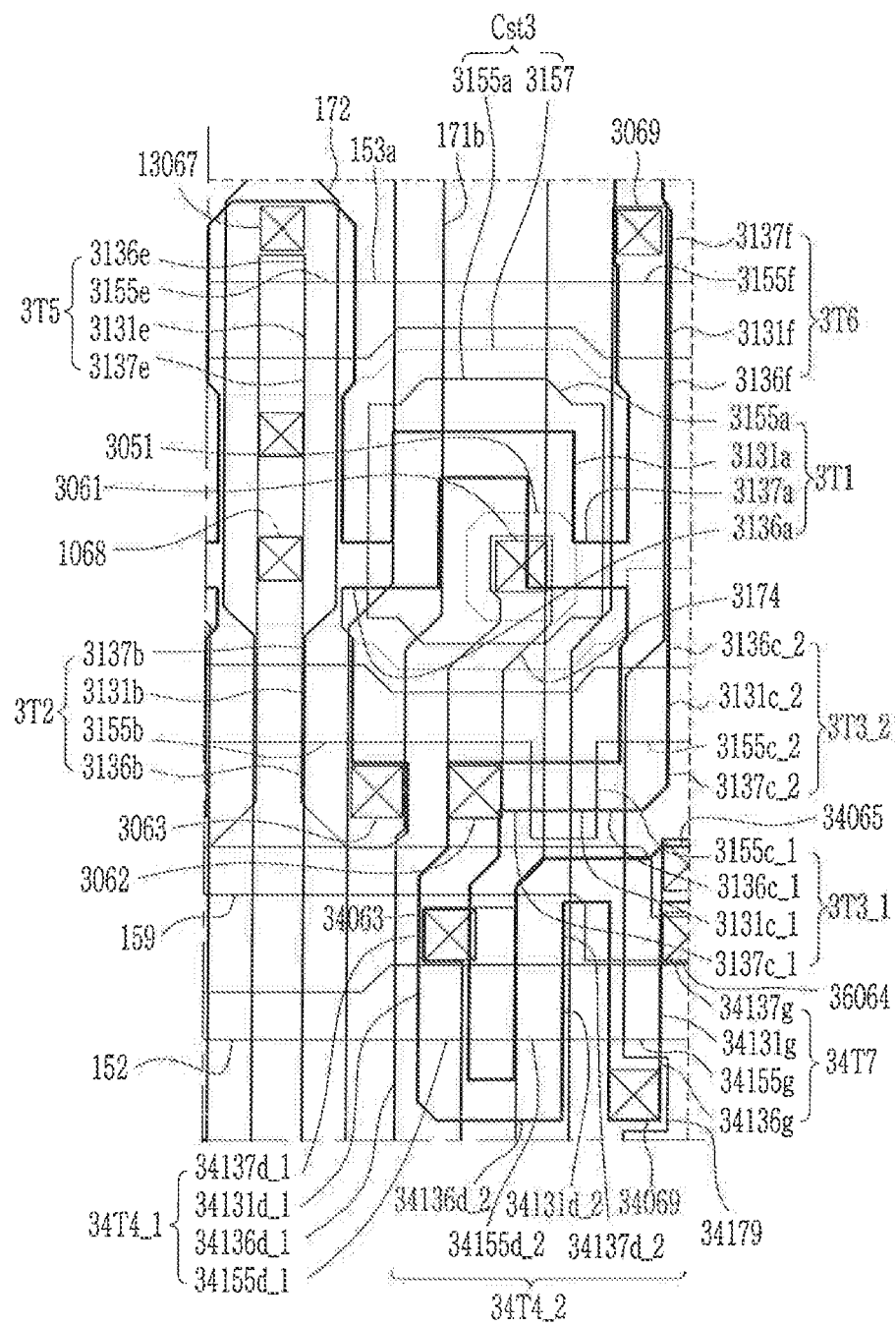
FIG. 9 is a top plan view showing a third pixel from among a plurality of pixels of FIG. 6 according to an exemplary embodiment.
Figure 10:
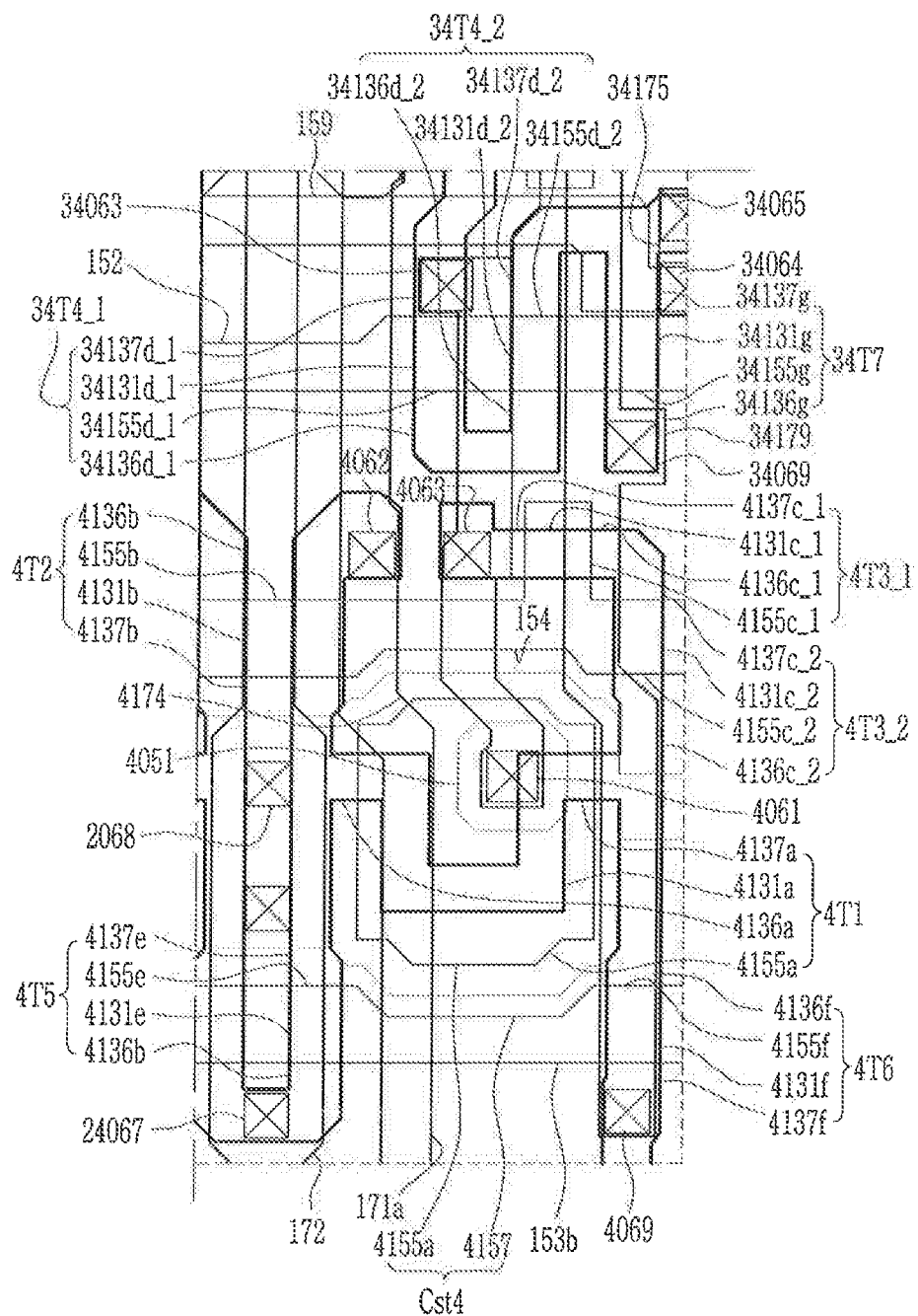
FIG. 10 is a top plan view showing a fourth pixel from among a plurality of pixels of FIG. 6 according to an exemplary embodiment.
Figure 11:
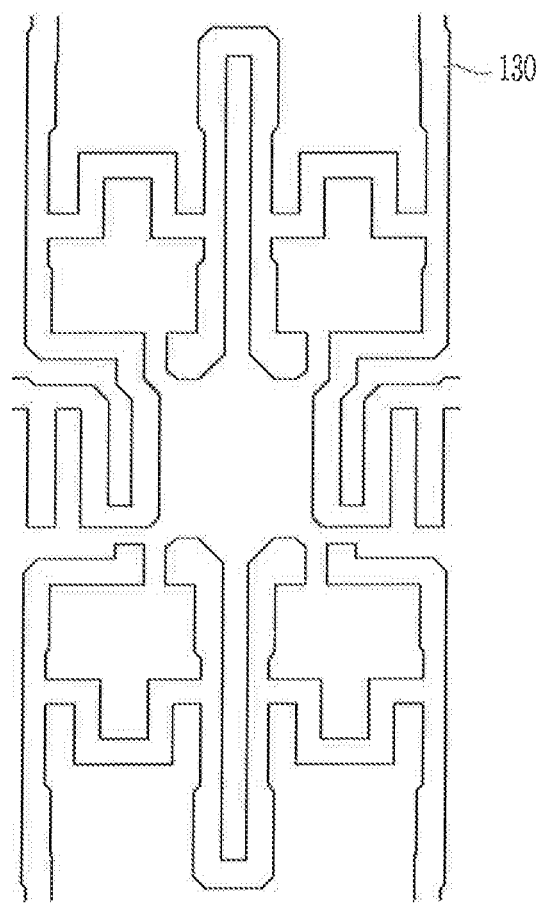
FIG. 11 is a top plan view showing an active pattern of a display device according to an exemplary embodiment.
Figure 12:
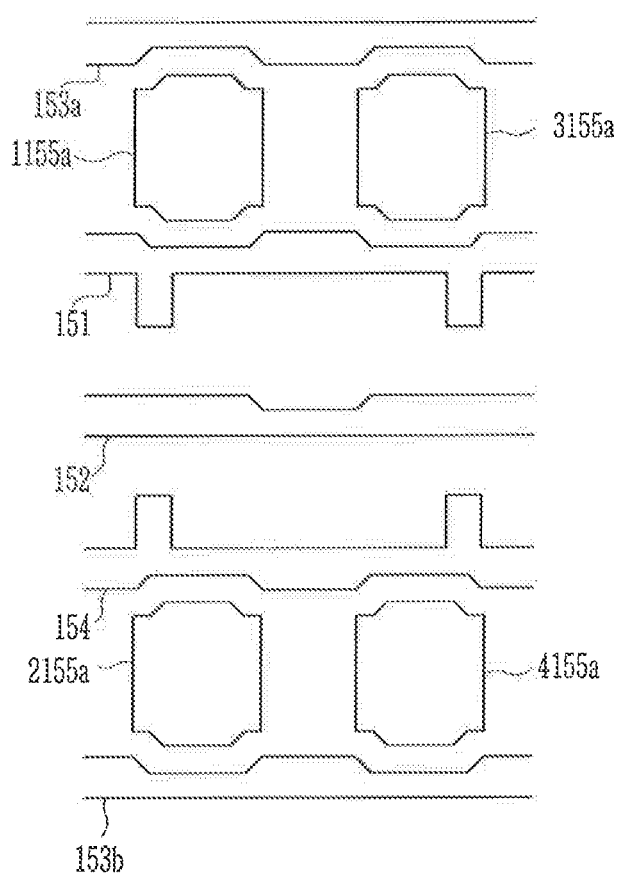
FIG. 12 is a top plan view showing a first conductive layer of a display device according to an exemplary embodiment.
Figure 13:
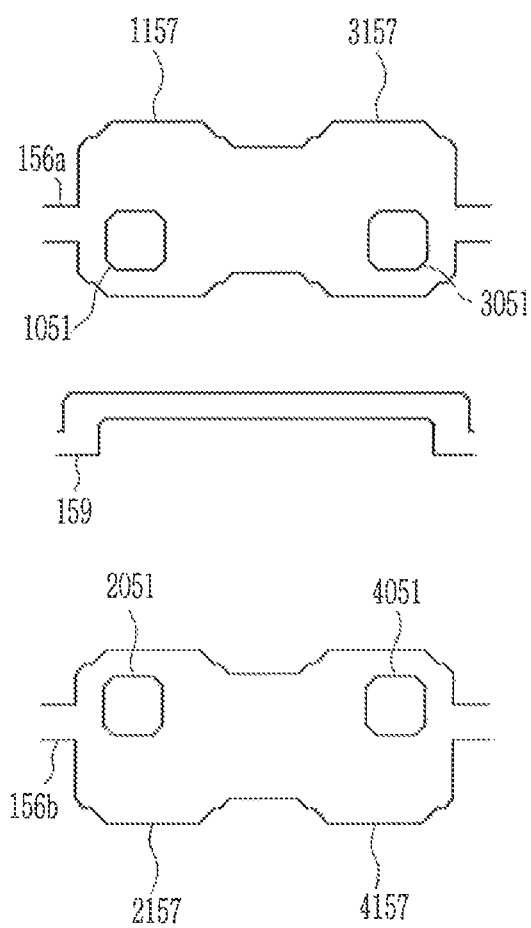
FIG. 13 is a top plan view showing a second conductive layer of a display device according to an exemplary embodiment.
Figure 14:
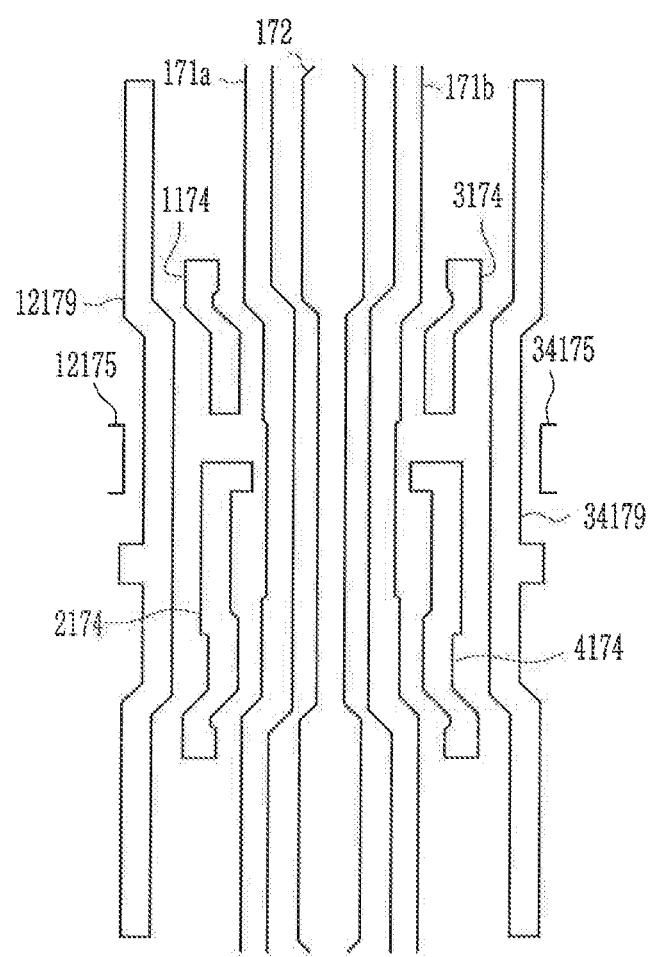
FIG. 14 is a top plan view showing a third conductive layer of a display device according to an exemplary embodiment.
Figure 15:
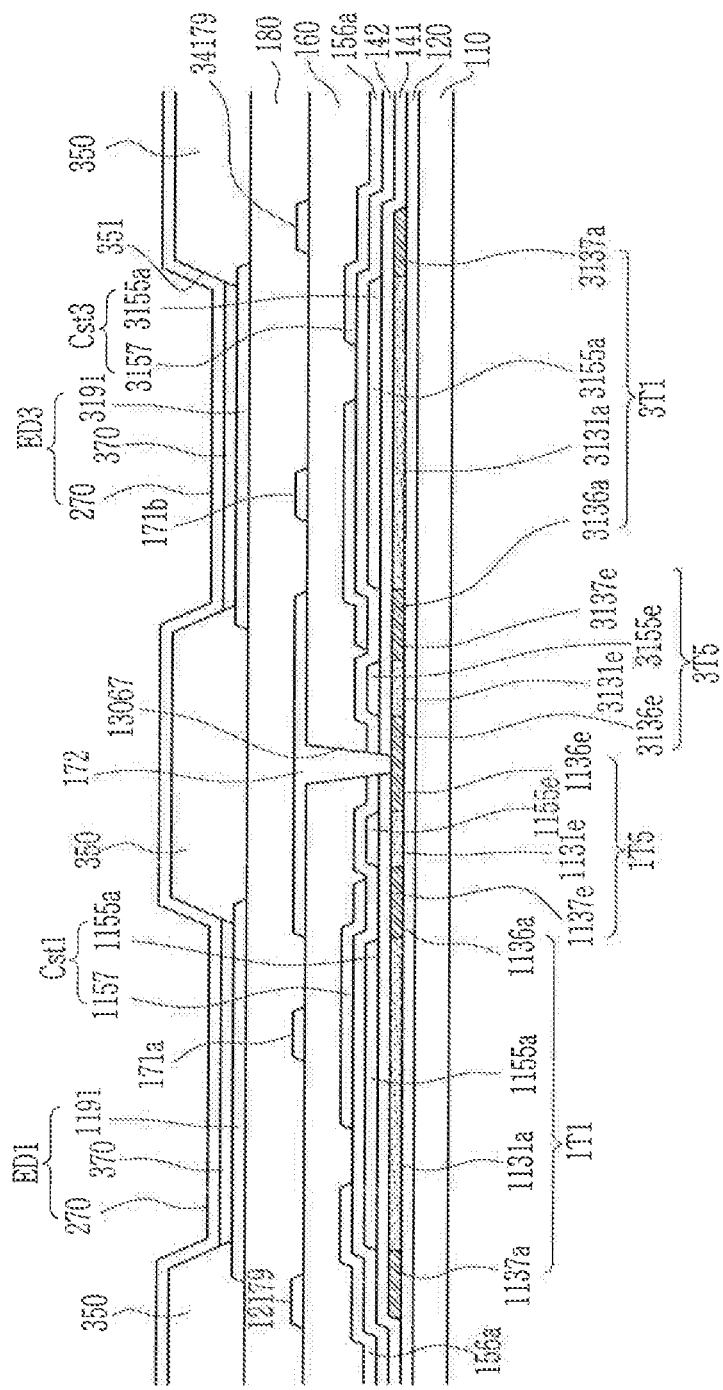
FIG. 15 is a cross-sectional view taken along line XV-XV of FIG. 6 according to an exemplary embodiment.
Figure 16:
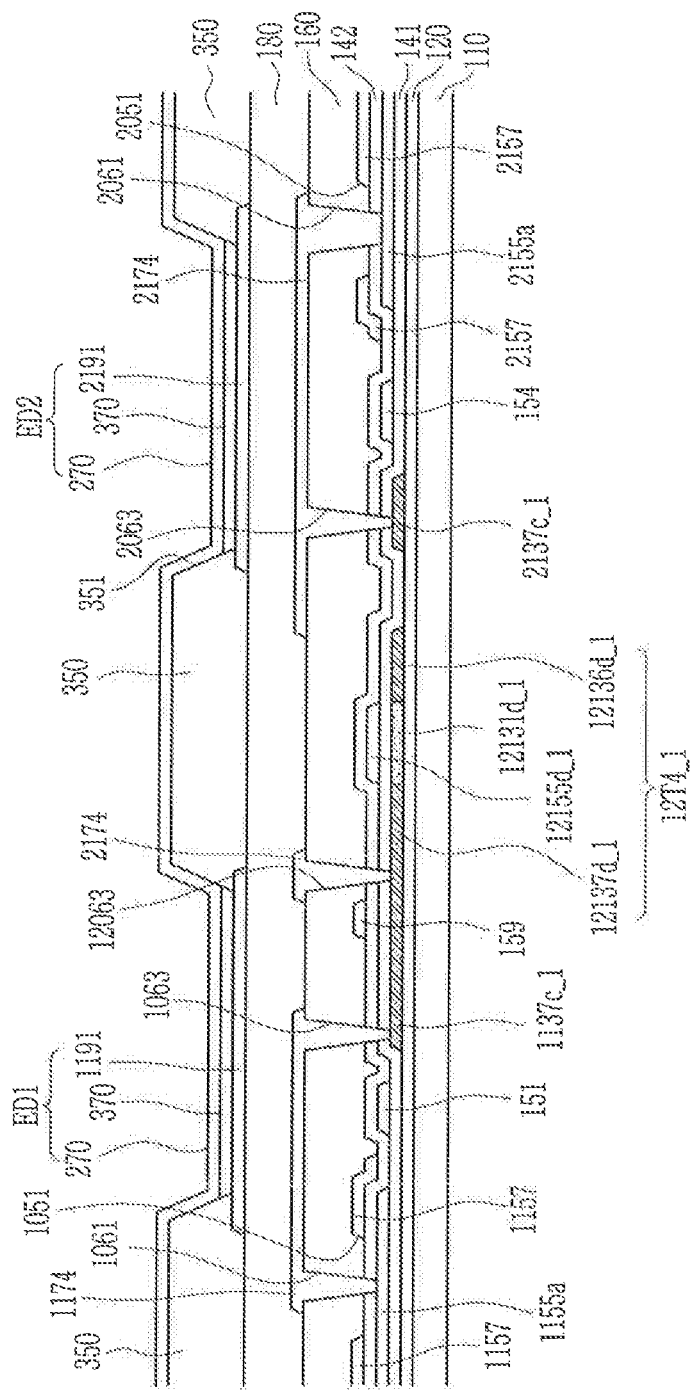
FIG. 16 is a cross-sectional view taken along line XVI-XVI of FIG. 6 according to an exemplary embodiment.
Figure 17:
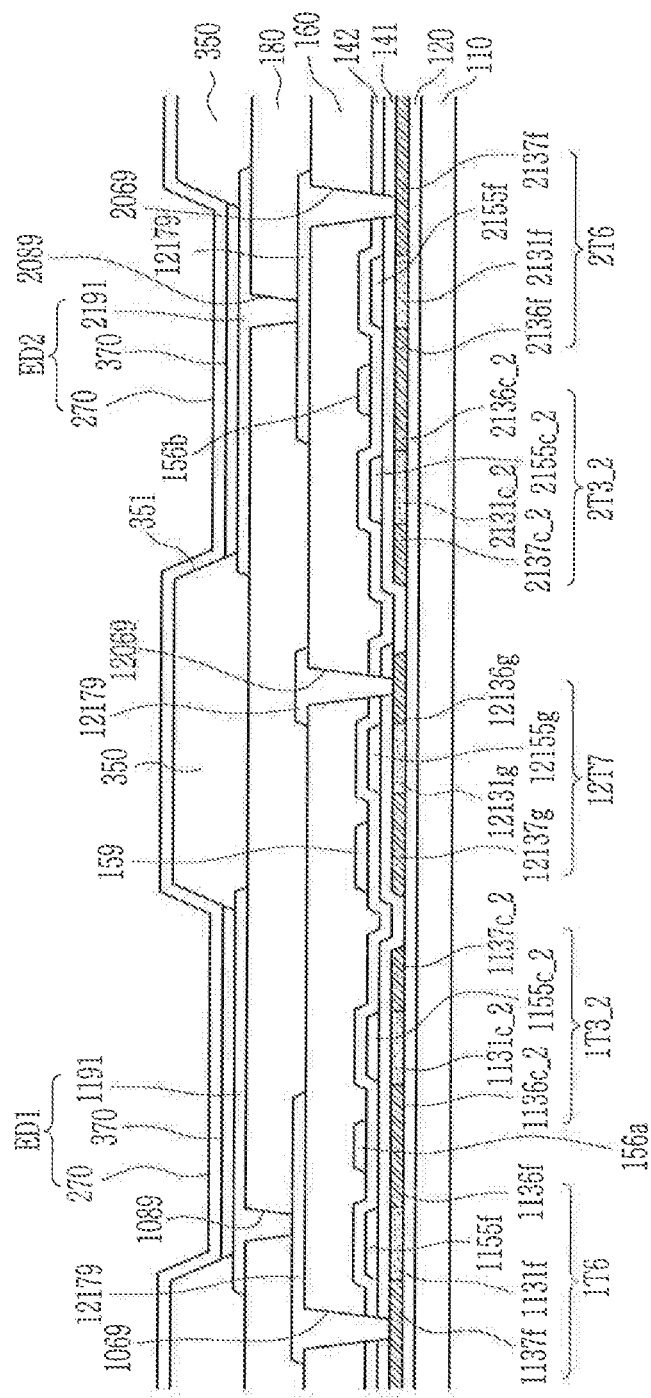
FIG. 17 is a cross-sectional view taken along line XVII-XVII of FIG. 6 according to an exemplary embodiment.
Figure 18:
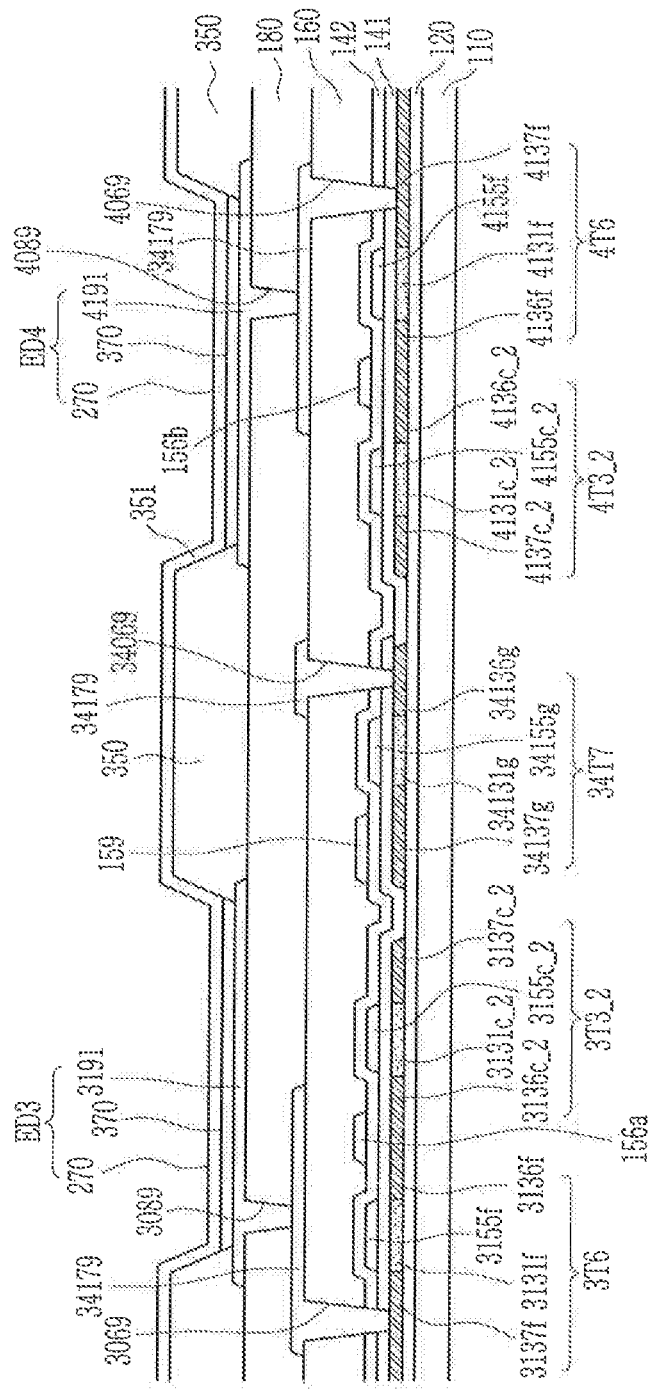
FIG. 18 is a cross-sectional view taken along line XVIII-XVIII of FIG. 6 according to an exemplary embodiment.

FIG. 6 is a top plan view showing a plurality of pixels adjacent to each other in a display device according to an exemplary embodiment. FIG. 7 is a top plan view showing a first pixel from among a plurality of pixels of FIG. 6 according to an exemplary embodiment. FIG. 8 is a top plan view showing a second pixel from among a plurality of pixels of FIG. 6 according to an exemplary embodiment. FIG. 9 is a top plan view showing a third pixel from among a plurality of pixels of FIG. 6 according to an exemplary embodiment. FIG. 10 is a top plan view showing a fourth pixel from among a plurality of pixels of FIG. 6 according to an exemplary embodiment. FIGS. 11 to 14 are top plan views showing a partial layer of a display device according to an exemplary embodiment. FIG. 11 is a top plan view showing an active pattern of a display device according to an exemplary embodiment. FIG. 12 is a top plan view showing a first conductive layer of a display device according to an exemplary embodiment. FIG. 13 is a top plan view showing a second conductive layer of a display device according to an exemplary embodiment. FIG. 14 is a top plan view showing a third conductive layer of a display device according to an exemplary embodiment. FIG. 15 is a cross-sectional view taken along line XV-XV of FIG. 6 according to an exemplary embodiment. FIG. 16 is a cross-sectional view taken along line XVI-XVI of FIG. 6 according to an exemplary embodiment. FIG. 17 is a cross-sectional view taken along line XVII-XVII of FIG. 6 according to an exemplary embodiment. FIG. 18 is a cross-sectional view taken along line XVIII-XVIII of FIG. 6 according to an exemplary embodiment.

The plurality of pixels PX1, PX2, PX3, and PX4 included in the display device according to an exemplary embodiment may respectively display a predetermined color. For example, the plurality of pixels may include a red pixel that displays red, a green pixel that displays green, and a blue pixel that displays blue. According to exemplary embodiments, at least one pixel from among the red pixel, the green pixel, and the blue pixel may display other colors. Further, according to exemplary embodiments, a pixel that displays other colors as well as red, green, and blue may be further included.

The plurality of pixels PX1, PX2, PX3, and PX4 may include a first pixel PX1, a second pixel PX2, a third pixel PX3, and a fourth pixel PX4. The first pixel PX1 and the second pixel PX2 are adjacent to each other in the first direction D1, and the third pixel PX3 and the fourth pixel PX4 are adjacent to each other in the first direction D1. The first pixel PX1 and the third pixel PX3 are adjacent to each other in the second direction D2, and the second pixel PX2 and the fourth pixel PX4 are adjacent to each other in the second direction D2. The first direction D1 and the second direction D2 are different from each other, and the second direction D2 may be substantially perpendicular to the first direction D1. For example, the first direction D1 may be a horizontal direction, and the second direction D2 may be a vertical direction crossing the first direction D1.

The display device according to an exemplary embodiment may include a first conductive layer including a first scan line 151 transmitting the first scan signal GW(n−1), a second scan line 152 transmitting the second scan signal GI(n), a third scan line 154 transmitting the third scan signal GW(n), and first and second control lines 153a and 153b transmitting the light emission control signals EM(n−1) and EM(n). The first conductive layer may be disposed on one surface of a substrate 110 in a cross-section, may include the same material, and may be disposed on the same layer.

The substrate 110 may include an inorganic or organic insulating material such as, for example, glass, plastic, etc., and may have flexibility of various levels.

The first, second, and third scan lines 151, 152, and 154, and the first and second control lines 153a and 153b, may be elongated in substantially the same direction (for example, the horizontal direction D2) on a plane. For example, the first, second, and third scan lines 151, 152, and 154, and the first and second control lines 153a and 153b, may extend lengthwise in substantially the same direction. The first control line 153a and the first scan line 151 may pass the first pixel PX1 and the third pixel PX3, and the third scan line 154 and the second control line 153b may pass the second pixel PX2 and the fourth pixel PX4. For example, the first control line 153a and the first scan line 151 may extend through the first pixel PX1 and the third pixel PX3, and the third scan line 154 and the second control line 153b may extend through the second pixel PX2 and the fourth pixel PX4. The first pixel PX1 and the second pixel PX2 have a region shared with each other, and the third pixel PX3 and the fourth pixel PX4 have a region shared with each other. The second scan line 152 may pass the first pixel PX1, the second pixel PX2, the third pixel PX3, and the fourth pixel PX4. For example, the second scan line 152 may extend through the first pixel PX1, the second pixel PX2, the third pixel PX3, and the fourth pixel PX4. In this case, the second scan line 152 passes the region that the first pixel PX1 and the second pixel PX2 share with each other and the region that the third pixel PX3 and the fourth pixel PX4 share with each other.

The display device according to an exemplary embodiment may further include a second conductive layer including a first storage line 156a, a second storage line 156b, and an initialization voltage line 159. The second conductive layer is disposed on a different layer from the first conductive layer in a cross-section. For example, the second conductive layer may be disposed on the first conductive layer in a cross-section, may include the same material, and may be disposed on the same layer.

The first and second storage lines 156a and 156b and the initialization voltage line 159 may be elongated in substantially the same direction (for example, the horizontal direction D2) on a plane (see FIG. 13). For example, the first and second storage lines 156a and 156a and the initialization voltage line 159 may extend lengthwise in substantially the same direction. The first storage line 156a may be disposed between the first scan line 151 and the first control line 153a on a plane, and may pass the first pixel PX1 and the third pixel PX3. The first storage line 156a may include an extension 1157 disposed at the first pixel PX1 and an extension 3157 disposed at the third pixel PX3. The first storage line 156a is connected to the driving voltage line 172 through a contact hole 1068, thereby receiving the driving voltage ELVDD. Storage openings 1051 and 3051 are formed in the extensions 1157 and 3157. The second storage line 156b may be disposed between the third scan line 154 and the second control line 153b on a plane, and may pass the second pixel PX2 and the fourth pixel PX4. The second storage line 156b may include an extension 2157 disposed at the second pixel PX2 and an extension 4157 disposed at the fourth pixel PX4. The second storage line 156b may be connected with the driving voltage line 172 through a contact hole 2068 to receive the driving voltage ELVDD. Storage openings 2051 and 4051 are formed in the extensions 2157 and 4157.

The initialization voltage line 159 transmits the initialization voltage Vint, and may be disposed between the first scan line 151 and the second scan line 152 on a plane. However, the initialization voltage line 159 is not limited thereto.

The display device according to an exemplary embodiment may include a third conductive layer including the first data line 171a transmitting the first data signal D(m), the second data line 171b transmitting the second data signal D(m+1), and the driving voltage line 172 transmitting the driving voltage ELVDD. The third conductive layer is disposed on a different layer from the first conductive layer and the second conductive layer on a cross-section. For example, the third conductive layer may be disposed on the second conductive layer on a cross-section, may include the same material, and may be disposed on the same layer.

The first data line 171a, the second data line 171b, and the driving voltage line 172 may be elongated on a plane in the same direction (for example, the vertical direction D1). For example, the first data line 171a, the second data line 171b, and the driving voltage line 172 may extend lengthwise in substantially the same direction. The first data line 171a, the second data line 171b, and the driving voltage line 172 may cross the first, second, and third scan lines 151, 152, and 154, the first and second control lines 153a and 153b, the initialization voltage line 159, and the first and second storage lines 156a and 156b. The first data line 171a may pass the first pixel PX1 and the second pixel PX2, and the second data line 171b may pass the third pixel PX3 and the fourth pixel PX4. The first pixel PX1 and the third pixel PX3 have a region shared with each other, and the second pixel PX2 and the fourth pixel PX4 have a region shared with each other. The driving voltage line 172 is disposed between the first data line 171a and the second data line 171b, and may pass the first pixel PX1, the second pixel PX2, the third pixel PX3, and the fourth pixel PX4. In this case, the driving voltage line 172 passes the region where the first pixel PX1 and the third pixel PX3 are shared with each other and the region where the second pixel PX2 and the fourth pixel PX4 are shared with each other.

Each of the pixels PX1, PX2, PX3, and PX4 may include a plurality of transistors 1T1, 2T1, 3T1, 4T1, 1T2, 2T2, 3T2, 4T2, 1T3, 2T3, 3T3, 4T3, 12T4, 34T4, 1T5, 2T5, 3T5, 4T5, 1T6, 2T6, 3T6, 4T6, 12T7, and 34T7 and the capacitors Cst1, Cst2, Cst3, and Cst4 that are connected to the first, second, and third scan lines 151, 152, and 154, the first and second control lines 153a and 153b, the first and second data lines 171a and 171b, and the driving voltage line 172, and the light emitting diodes (LED) ED1, ED2, ED3, and ED4.

Each channel of the plurality of transistors 1T1, 2T1, 3T1, 4T1, 1T2, 2T2, 3T2, 4T2, 1T3, 2T3, 3T3, 4T3, 12T4, 34T4, 1T5, 2T5, 3T5, 4T5, 1T6, 2T6, 3T6, 4T6, 12T7, and 34T7 of the pixels PX1, PX2, PX3, and PX4 may be formed inside an active pattern 130. The active pattern 130 may be curved with various shapes. The active pattern 130 may include a semiconductor material such as, for example, a polysilicon or an oxide semiconductor.

The active pattern 130 may be disposed between the substrate 110 and the first conductive layer on a cross-section.

The active pattern 130 includes channel regions 1131a, 2131a, 3131a, 4131a, 1131b, 2131b, 3131b, 4131b, 1131c_1, 1131c_2, 2131c_1, 2131c_2, 3131c_1, 3131c_2, 4131c_1, 4131c_2, 12131d_1, 12131d_2, 34131d_1, 34131d_2, 1131e, 2131e, 3131e, 4131e, 1131f, 2131f, 3131f, 4131f, 12131g, and 34131g in which a channel of each of the transistors 1T1, 2T1, 3T1, 4T1, 1T2, 2T2, 3T2, 4T2, 1T3, 2T3, 3T3, 4T3, 12T4, 34T4, 1T5, 2T5, 3T5, 4T5, 1T6, 2T6, 3T6, 4T6, 12T7, and 34T7 is formed, and conductive regions. For example, the third transistors 1T3, 2T3, 3T3, and 4T3 and the fourth transistors 12T4 and 34T4 of each of the pixels PX1, PX2, PX3, and PX4 may have a dual gate structure. In this case, each of the third transistors 1T3, 2T3, 3T3, and 4T3 may include two channel regions 1131c_1, 1131c_2, 2131c_1, 2131c_2, 3131c_1, 3131c_2, 4131c_1, and 4131c_2, and each of the fourth transistors 12T4 and 34T4 may include two channel regions 12131d_1, 12131d_2, 34131d_1, and 34131d_2.

The conductive region of the active pattern 130 is disposed at both sides of the channel regions 1131a, 2131a, 3131a, 4131a, 1131b, 2131b, 3131b, 4131b, 1131c_1, 1131c_2, 2131c_1, 2131c_2, 3131c_1, 3131c_2, 4131c_1, 4131c_2, 12131d_1, 12131d_2, 34131d_1, 34131d_2, 1131e, 2131e, 3131e, 4131e, 1131f, 2131f, 3131f, 4131f, 12131g, and 34131g and has a higher carrier concentration than the carrier concentration of the channel regions 1131a, 2131a, 3131a, 4131a, 1131b, 2131b, 3131b, 4131b, 1131c_1, 1131c_2, 2131c_1, 2131c_2, 3131c_1, 3131c_2, 4131c_1, 4131c_2, 12131d_1, 12131d_2, 34131d_1, 34131d_2, 1131e, 2131e, 3131e, 4131e, 1131f, 2131f, 3131f, 4131f, 12131g, and 34131g. In the active pattern 130, most of the region except for the channel regions 1131a, 2131a, 3131a, 4131a, 1131b, 2131b, 3131b, 4131b, 1131c_1, 1131c_2, 2131c_1, 2131c_2, 3131c_1, 3131c_2, 4131c_1, 4131c_2, 12131d_1, 12131d_2, 34131d_1, 34131d_2, 1131e, 2131e, 3131e, 4131e, 1131f, 2131f, 3131f, 4131f, 12131g, and 34131g may be the conductive region. A pair of conductive regions disposed at both sides of the channel regions 1131a, 2131a, 3131a, 4131a, 1131b, 2131b, 3131b, 4131b, 1131c_1, 1131c_2, 2131c_1, 2131c_2, 3131c_1, 3131c_2, 4131c_1, 4131c_2, 12131d_1, 12131d_2, 34131d_1, 34131d_2, 1131e, 2131e, 3131e, 4131e, 1131f, 2131f, 3131f, 4131f, 12131g, and 34131g of each of the transistors 1T1, 2T1, 3T1, 4T1, 1T2, 2T2, 3T2, 4T2, 1T3, 2T3, 3T3, 4T3, 12T4, 34T4, 1T5, 2T5, 3T5, 4T5, 1T6, 2T6, 3T6, 4T6, 12T7, and 34T7 may have a function of a source electrode and a drain electrode as a source region and a drain region of the corresponding transistors 1T1, 2T1, 3T1, 4T1, 1T2, 2T2, 3T2, 4T2, 1T3, 2T3, 3T3, 4T3, 12T4, 34T4, 1T5, 2T5, 3T5, 4T5, 1T6, 2T6, 3T6, 4T6, 12T7, and 34T7.

The first transistors 1T1, 2T1, 3T1, and 4T1 of each of the pixels PX1, PX2, PX3, and PX4 include channel regions 1131a, 2131a, 3131a, and 4131a, source regions 1136a, 2136a, 3136a, and 4136a, and drain regions 1137a, 2137a, 3137a, and 4137a as the conductive region of the active pattern 130 disposed at both sides of the channel regions 1131a, 2131a, 3131a, and 4131a, and driving gate electrodes 1155a, 2155a, 3155a, and 4155a overlapping the channel regions 1131a, 2131a, 3131a, and 4131a on a plane.

The channel regions 1131a, 2131a, 3131a, and 4131a of the first transistors 1T1, 2T1, 3T1, and 4T1 may be bent at least once. For example, the channel regions 1131a, 2131a, 3131a, and 4131a may have a meandering shape or a zigzag shape.

The source regions 1136a, 2136a, 3136a, and 4136a and the drain regions 1137a, 2137a, 3137a, and 4137a are connected to both sides of the channel regions 1131a, 2131a, 3131a, and 4131a on a plane.

The driving gate electrodes 1155a, 2155a, 3155a, and 4155a of each of the pixels PX1, PX2, PX3, and PX4 may be included in the first conductive layer, and may be respectively connected to connecting members 1174, 2174, 3174, and 4174 through contact holes 1061, 2061, 3061, and 4061 and storage openings 1051, 2051, 3051, and 4051. The storage openings 1051, 2051, 3051, and 4051 enclose the contact holes 1061, 2061, 3061, and 4061. The connecting members 1174, 2174, 3174, and 4174 may be included in the third conductive layer on a cross-section. The connecting members 1174, 2174, 3174, and 4174 may extend to be elongated in the direction substantially parallel to the direction that the first and second data lines 171a and 171b extend. For example, the connecting members 1174, 2174, 3174, and 4174 may extend lengthwise in substantially the same direction as the first and second data lines 171a and 171b. The connecting members 1174, 2174, 3174, and 4174 correspond to driving gate nodes GN1, GN2, GN3, and GN4 in the circuit diagram of FIG. 1 along with the driving gate electrodes 1155a, 2155a, 3155a, and 4155a.

The second transistors 1T2, 2T2, 3T2, and 4T2 of each of the pixels PX1, PX2, PX3, and PX4 include channel regions 1131b, 2131b, 3131b, and 4131b, source regions 1136b, 2136b, 3136b, and 4136b, and drain regions 1137b, 2137b, 3137b, and 4137b as the conductive region of the active pattern 130 disposed at both sides of the channel regions 1131b, 2131b, 3131b, and 4131b, and gate electrodes 1155b, 2155b, 3155b, and 4155b overlapping the channel regions 1131b, 2131b, 3131b, and 4131b on a plane. The gate electrodes 1155b, 2155b, 3155b, and 4155b are a part of the first scan line 151 or the third scan line 154. In the first and third pixels PX1 and PX3, the gate electrodes 1155b and 3155b of the second transistors 1T2 and 3T2 are a part of the first scan line 151. In the second and fourth pixels PX2 and PX4, the gate electrodes 2155b and 4155b of the second transistors 2T2 and 4T2 are a part of the third scan line 154. The source regions 1136b, 2136b, 3136b, and 4136b are connected to the channel regions 1131b, 2131b, 3131b, and 4131b and are connected to the first data line 171a or the second data line 171b through the contact holes 1062, 2062, 3062, and 4062, respectively. In the first and second pixels PX1 and PX2, the source regions 1136b and 2136b of the second transistors 1T2 and 2T2 are connected to the first data line 171a. In the third and fourth pixels PX3 and PX4, the source regions 3136b and 4136b of the second transistors 3T2 and 4T2 are connected to the second data line 171b. The drain regions 1137b, 2137b, 3137b, and 4137b are connected to the channel regions 1131b, 2131b, 3131b, and 4131b and are connected to the source regions 1136a, 2136a, 3136a, and 4136a of the first transistors 1T1, 2T1, 3T1, and 4T1.

The third transistors 1T3, 2T3, 3T3, and 4T3 of each of the pixels PX1, PX2, PX3, and PX4 may be formed of two parts. As a result, a leakage current may be prevented or reduced. For example, the third transistors 1T3, 2T3, 3T3, and 4T3 may include first sub-transistors 1T3_1, 2T3_1, 3T3_1, and 4T3_1 and second sub-transistors 1T3_2, 2T3_2, 3T3_2, and 4T3_2 adjacent to each other and connected to each other.

The first sub-transistors 1T3_1, 2T3_1, 3T3_1, and 4T3_1 of the third transistors 1T3, 2T3, 3T3, and 4T3 include channel regions 1131c_1, 2131c_1, 3131c_1, and 4131c_1 overlapping the first scan line 151 or the third scan line 154 on a plane, source regions 1136c_1, 2136c_1, 3136c_1, and 4136c_1 and drain regions 1137c_1, 2137c_1, 3137c_1, and 4137c_1 as the conductive region of the active pattern 130 disposed at both sides of the channel regions 1131c_1, 2131c_1, 3131c_1, and 4131c_1, and gate electrodes 1155c_1, 2155c_1, 3155c_1, and 4155c_1 overlapping the channel regions 1131c_1, 2131c_1, 3131c_1, and 4131c_1. The gate electrodes 1155c_1, 2155c_1, 3155c_1, and 4155c_1 may be a part of the protrusion of the first scan line 151 or the third scan line 154. The drain regions 1137c_1, 2137c_1, 3137c_1, and 4137c_1 are connected to the connecting members 1174, 2174, 3174, and 4174 through contact holes 1063, 2063, 3063, and 4063.

The second sub-transistors 1T3_2, 2T3_2, 3T3_2, and 4T3_2 of the third transistors 1T3, 2T3, 3T3, and 4T3 include channel regions 1131c_2, 2131c_2, 3131c_2, and 4131c_2 overlapping the first scan line 151 or the third scan line 154 on a plane, source regions 1136c_2, 2136c_2, 3136c_2, and 4136c_2 and drain regions 1137c_2, 2137c_2, 3137c_2, and 4137c_2 as the conductive region of the active pattern 130 disposed at both sides of the channel regions 1131c_2, 2131c_2, 3131c_2, and 4131c_2, and gate electrodes 1155c_2, 2155c_2, 3155c_2, and 4155c_2 overlapping the channel regions 1131c_2, 2131c_2, 3131c_2, and 4131c_2. The gate electrodes 1155c_2, 2155c_2, 3155c_2, and 4155c_2 are a part of the first scan line 151 or the third scan line 154. The source regions 1136c_2, 2136c_2, 3136c_2, and 4136c_2 of the second sub-transistors 1T3_2, 2T3_2, 3T3_2, and 4T3_2 are connected to the drain regions 1137a, 2137a, 3137a, and 4137a of the first transistors 1T1, 2T1, 3T1, and 4T1, and the drain regions 1137c_2, 2137c_2, 3137c_2, and 4137c_2 are connected to the source regions 1136c_1, 2136c_1, 3136c_1, and 4136c_1 of the first sub-transistors 1T3_1, 2T3_1, 3T3_1, and 4T3_1. The fourth transistors 12T4 and 34T4 of each of the pixels PX1, PX2, PX3, and PX4 may be formed of two parts. As a result, a leakage current may be reduced or prevented. For example, the fourth transistors 12T4 and 34T4 may include first sub-transistors 12T4_1 and 34T4_1 and second sub-transistors 12T4_2 and 34T4_2 adjacent to each other and connected to each other.

The first sub-transistors 12T4_1 and 34T4_1 of the fourth transistors 12T4 and 34T4 include channel regions 12131d_1 and 34131d_1 overlapping the second scan line 152 on a plane, source regions 12136d_1 and 34136d_1 and drain regions 12137d_1 and 34137d_1 as the conductive region of the active pattern 130 disposed at both sides of the channel regions 12131d_1 and 34131d_1, and gate electrodes 12155d_1 and 34155d_1 overlapping the channel regions 12131d_1 and 12131d_1. The gate electrodes 12155d_1 and 34155d_1 are a part of the second scan line 152. The drain region 12137d_1 of the first sub-transistor 12T4_1 of the fourth transistor 12T4 shared between the first pixel PX1 and the second pixel PX2 is connected to the drain regions 1137c_1 and 2137c_1 of the first sub-transistors 1T3_1 and 2T3_1 of the third transistors 1T3 and 2T3 of the first and second pixels PX1 and PX2. Also, the drain region 12137d_1 of the first sub-transistor 12T4_1 of the fourth transistor 12T4 shared between the first pixel PX1 and the second pixel PX2 is connected to the connecting members 1174 and 2174 through contact holes 1063 and 12063. The drain region 34137d_1 of the first sub-transistor 34T4_1 of the fourth transistor 34T4 shared between the third pixel PX3 and the fourth pixel PX4 is connected to the drain regions 3137c_1 and 4137c_1 of the first sub-transistors 3T3_1 and 4T3_1 of the third transistors 3T3 and 4T3 of the third and fourth pixels PX3 and PX4. Also, the drain region 34137d_1 of the first sub-transistor 34T4_1 of the fourth transistor 34T4 shared between the third pixel PX3 and the fourth pixel PX4 are connected to the connecting members 3174 and 4174 through contact holes 3063 and 34063.

The second sub-transistor 12T4_2 and 34T4_2 of the fourth transistor 12T4 and 34T4 includes channel regions 12131d_2 and 34131d_2 overlapping the second scan line 152 on a plane, source regions 12136d_2 and 34136d_2 and drain regions 12137d_2 and 34137d_2 as the conductive region of the active pattern 130 disposed at both sides of the channel regions 12131d_2 and 34131d_2, and gate electrodes 12155d_2 and 34155d_2 overlapping the channel regions 12131d_2 and 34131d_2. The gate electrodes 12155d_2 and 34155d_2 are a part of the second scan line 152. The drain regions 12137d_2 and 34137d_2 are connected to the source regions 12136d_1 and 34136d_1 of the first sub-transistors 12T4_1 and 34T4_1 of the fourth transistors 12T4 and 34T4, and the source regions 12136d_2 and 34136d_2 are connected to the connecting members 12175 and 34175 through contact holes 12065 and 34065.

Connecting members 12175 and 34175 may be included in the third conductive layer on a cross-section. The connecting members 12175 and 34175 may be electrically connected to the initialization voltage line 159 through contact holes 12064 and 34064.

The fifth transistors 1T5, 2T5, 3T5, and 4T5 of each of the pixels PX1, PX2, PX3, and PX4 include channel regions 1131e, 2131e, 3131e, and 4131e, source regions 1136e, 2136e, 3136e, and 4136e and drain regions 1137e, 2137e, 3137e, and 4137e as the conductive region of the active pattern 130 disposed at both sides of the channel regions 1131e, 2131e, 3131e, and 4131e, and gate electrodes 1155e, 2155e, 3155e, and 4155e overlapping the channel regions 1131e, 2131e, 3131e, and 4131e. The gate electrodes 1155e, 2155e, 3155e, and 4155e are a part of the first control line 153a or the second control line 153b. The source regions 1136e, 2136e, 3136e, and 4136e are connected to the channel regions 1131e, 2131e, 3131e, and 4131e, and are connected to the driving voltage line 172 through contact holes 13067 and 24067. The source region 1136e of the fifth transistor 1T5 of the first pixel PX1 and the source region 3136e of the fifth transistor 3T5 of the third pixel PX3 are connected to each other. The source region 2136e of the fifth transistor 2T5 of the second pixel PX2 and the source region 4136e of the fifth transistor 4T5 of the fourth pixel PX4 are connected to each other. The drain regions 1137e, 2137e, 3137e, and 4137e are connected to the channel regions 1131e, 2131e, 3131e, and 4131e and are connected to the source regions 1136a, 2136a, 3136a, and 4136a of the first transistors 1T1, 2T1, 3T1, and 4T1.

The sixth transistors 1T6, 2T6, 3T6, and 4T6 of each of the pixels PX1, PX2, PX3, and PX4 include channel regions 1131f, 2131f, 3131f, and 4131f, source regions 1136f, 2136f, 3136f, and 4136f and drain regions 1137f, 2137f, 3137f, and 4137f as the conductive region of the active pattern 130 disposed at both sides of the channel regions 1131f, 2131f, 3131f, and 4131f, and gate electrodes 1155f, 2155f, 3155f, and 4155f overlapping the channel regions 1131f, 2131f, 3131f, and 4131f. The gate electrodes 1155f, 2155f, 3155f, and 4155f are a part of the first control line 153a or the second control line 153b. The source regions 1136f, 2136f, 3136f, and 4136f are connected to the channel regions 1131f, 2131f, 3131f, and 4131f, and are connected to the drain regions 1137a, 2137a, 3137a, and 4137a of the first transistors 1T1, 2T1, 3T1, and 4T1. The drain regions 1137f, 2137f, 3137f, and 4137f are connected to the channel regions 1131f, 2131f, 3131f, and 4131f and are connected to the connecting members 12179 and 34179 through contact holes 1069, 2069, 3069, and 4069. The connecting members 12179 and 34179 may be included in the third conductive layer on a cross-section.

The seventh transistors 12T7 and 34T7 of each of the pixels PX1, PX2, PX3, and PX4 include channel regions 12131g and 34131g, source regions 12136g and 34136g and drain regions 12137g and 34137g as the conductive region of the active pattern 130 disposed at both sides of the channel regions 12131g and 34131g, and gate electrodes 12155g and 34155g overlapping the channel regions 12131g and 34131g. The gate electrodes 12155g and 34155g are a part of the second scan line 152. The source regions 12136g and 34136g are connected to the channel regions 12131g and 34131g, and are connected to the connecting members 12179 and 34179 through contact holes 12069 and 34069. The source regions 12136g and 34136g are connected to the drain regions 1137f, 2137f, 3137f, and 4137f of the sixth transistors 1T6, 2T6, 3T6, and 4T6 through the connecting members 12179 and 34179. The drain regions 1137f, 2137f, 3137f, and 4137f are connected to the connecting members 12175 and 34175 through the contact holes 12065 and 34065, thereby receiving the initialization voltage Vint.

The capacitors Cst1, Cst2, Cst3, and Cst4 include driving gate electrodes 1155a, 2155a, 3155a, and 4155a and the extensions 1157, 2157, 3157, and 4157 of the first and second storage lines 156a and 156b overlapping each other as two terminals on a plane. The capacitors Cst1, Cst2, Cst3, and Cst4 may maintain a voltage difference corresponding to a difference between the voltages of the extensions 1157, 2157, 3157, and 4157 of the first and second storage lines 156a and 156b receiving the driving voltage ELVDD and the driving gate electrodes 1155a, 2155a, 3155a, and 4155a. The extensions 1157, 2157, 3157, and 4157 of the first and second storage lines 156a and 156b may have a wider area than the driving gate electrodes 1155a, 2155a, 3155a, and 4155a on a plane, and may cover most of the corresponding driving gate electrodes 1155a, 2155a, 3155a, and 4155a.

The display device according to an exemplary embodiment may further include the fourth conductive layer including pixel electrodes 1191, 2191, 3191, and 4191 of each of the pixels PX1, PX2, PX3, and PX4. The fourth conductive layer is disposed at a different layer from the first conductive layer, the second conductive layer, and the third conductive layer on a cross-section. For example, the fourth conductive layer may be disposed on the third conductive layer on a cross-section, may include the same material, and may be disposed on the same layer.

The pixel electrodes 1191, 2191, 3191, and 4191 may be arranged in a matrix structure such as, for example, a PENTILE matrix structure. However, the arrangement of the pixel electrodes 1191, 2191, 3191, and 4191 is not limited thereto. For example, the pixel electrode of the red pixel and the pixel electrode of the blue pixel may be alternately arranged in the horizontal direction, the pixel electrode of the red pixel and the pixel electrode of the green pixel may be alternately arranged in one diagonal direction, and the pixel electrode of the blue pixel and the pixel electrode of the green pixel may be alternately arranged in the other diagonal direction. However, the arrangement structure of the pixel electrodes 1191, 2191, 3191, and 4191 is not limited thereto and may be variously changed.

The pixel electrodes 1191, 2191, 3191, and 4191 of each of the pixels PX1, PX2, PX3, and PX4 are connected to the connecting members 12179 and 34179 through contact holes 1089, 2089, 3089, and 4089, thereby receiving the voltage.

In an exemplary embodiment, the channel regions 1131a, 2131a, 3131a, and 4131a of the first transistors 1T1, 2T1, 3T1, and 4T1 have the bent shape. The channel region 1131a of the first transistor 1T1 of the first pixel PX1 and the channel region 2131a of the first transistor 2T1 of the second pixel PX2 are symmetrical to each other with respect to the second scan line 152. The channel region 1131a of the first transistor 1T1 of the first pixel PX1 and the channel region 3131a of the first transistor 3T1 of the third pixel PX3 are symmetrical to each other with respect to the driving voltage line 172. The channel region 3131a of the first transistor 3T1 of the third pixel PX3 and the channel region 4131a of the first transistor 4T1 of the fourth pixel PX4 are symmetrical to each other with respect to the second scan line 152. The channel region of the first transistor 2131a of the second pixel PX2 and the channel region 4131a of the first transistor 4T1 of the fourth pixel PX4 are symmetrical to each other with respect to the driving voltage line 172.

Similarly, in an exemplary embodiment, the channel region 1131b of the second transistor 1T2 of the first pixel PX1 and the channel region 2131b of the second transistor 2T2 of the second pixel PX2 are symmetrical to each other with respect to the second scan line 152. The channel region 1131b of the second transistor 1T2 of the first pixel PX1 and the channel region 3131b of the second transistor 3T2 of the third pixel PX3 are symmetrical to each other with respect to the driving voltage line 172. The channel region 3131b of the second transistor 3T2 of the third pixel PX3 and the channel region 4131b of the second transistor 4T2 of the fourth pixel PX4 are symmetrical to each other with respect to the second scan line 152. The channel region of the second transistor 2131b of the second pixel PX2 and the channel region 4131b of the second transistor 4T2 of the fourth pixel PX4 are symmetrical to each other with respect to the driving voltage line 172.

In an exemplary embodiment, the channel region 1131c of the third transistor 1T3 of the first pixel PX1 and the channel region 2131c of the third transistor 2T3 of the second pixel PX2 are symmetrical to each other with respect to the second scan line 152. The channel region 1131c of the third transistor 1T3 of the first pixel PX1 and the channel region 3131c of the third transistor 3T3 of the third pixel PX3 are symmetrical to each other with respect to the driving voltage line 172. The channel region 3131c of the third transistor 3T3 of the third pixel PX3 and the channel region 4131c of the third transistor 4T3 of the fourth pixel PX4 are symmetrical to each other with respect to the second scan line 152. The channel region of the third transistor 2131c of the second pixel PX2 and the channel region 4131c of the third transistor 4T3 of the fourth pixel PX4 are symmetrical to each other with respect to the driving voltage line 172.

In an exemplary embodiment, the channel region 1131e of the fifth transistor 1T5 of the first pixel PX1 and the channel region 2131e of the fifth transistor 2T5 of the second pixel PX2 are symmetrical to each other with respect to the second scan line 152. The channel region 1131e of the fifth transistor 1T5 of the first pixel PX1 and the channel region 3131e of the fifth transistor 3T5 of the third pixel PX3 are symmetrical to each other with respect to the driving voltage line 172. The channel region 3131e of the fifth transistor 3T5 of the third pixel PX3 and the channel region 4131e of the fifth transistor 4T5 of the fourth pixel PX4 are symmetrical to each other with respect to the second scan line 152. The channel region of the fifth transistor 2131e of the second pixel PX2 and the channel region 4131e of the fifth transistor 4T5 of the fourth pixel PX4 are symmetrical to each other with respect to the driving voltage line 172.

In an exemplary embodiment, the channel region 1131f of the sixth transistor 1T6 of the first pixel PX1 and the channel region 2131f of the sixth transistor 2T6 of the second pixel PX2 are symmetrical to each other with respect to the second scan line 152. The channel region 1131f of the sixth transistor 1T6 of the first pixel PX1 and the channel region 3131f of the sixth transistor 3T6 of the third pixel PX3 are symmetrical to each other with respect to the driving voltage line 172. The channel region 3131f of the sixth transistor 3T6 of the third pixel PX3 and the channel region 4131f of the sixth transistor 4T6 of the fourth pixel PX4 are symmetrical to each other with respect to the second scan line 152. The channel region of the sixth transistor 2131f of the second pixel PX2 and the channel region 4131f of the sixth transistor 4T6 of the fourth pixel PX4 are symmetrical to each other with respect to the driving voltage line 172. Next, a cross-sectional structure of the display device according to an exemplary embodiment will be described in detail.

A buffer layer 120 is disposed on a substrate 110. The buffer layer 120 blocks the transfer of impurities from the substrate 110 to an upper layer of the buffer layer 120, including the active pattern 130. As a result, characteristics of the active pattern 130 may be improved, and stress applied to the active pattern 130 may be reduced. The buffer layer 120 may include an inorganic insulating material such as, for example, a silicon nitride (SiNx) or a silicon oxide (SiOx), or an organic insulating material. In exemplary embodiments, at least part of the buffer layer 120 may be omitted.

The above-described active pattern 130 may be disposed on the buffer layer 120, and a first insulating layer 141 may be disposed on the active pattern 130.

The above-described first conductive layer may be disposed on the first insulating layer 141. The first conductive layer may include metals such as, for example, copper (Cu), aluminum (Al), molybdenum (Mo), and alloys thereof.

A second insulating layer 142 may be disposed on the first conductive layer and the first insulating layer 141.

The above-described second conductive layer may be disposed on the second insulating layer 142. The second conductive layer may include metals such as, for example, copper (Cu), aluminum (Al), molybdenum (Mo), and alloys thereof.

A third insulating layer 160 may be disposed on the second conductive layer and the second insulating layer 142.

At least one of the first insulating layer 141, the second insulating layer 142, and the third insulating layer 160 may include an inorganic insulating material such as, for example, a silicon nitride (SiNx), a silicon oxide (SiOx), and/or an organic insulating material.

The first insulating layer 141, the second insulating layer 142, and the third insulating layer 160 include the contact holes 1061, 2061, 3061, and 4061 disposed on the driving gate electrodes 1155a, 2155a, 3155a, and 4155a of each of the pixels PX1, PX2, PX3, and PX4. The first insulating layer 141, the second insulating layer 142, and the third insulating layer 160 further include the contact holes 1062, 2062, 3062, and 4062 disposed on the source regions 1136b, 2136b, 3136b, and 4136b of the second transistors 1T2, 2T2, 3T2, and 4T2. The first insulating layer 141, the second insulating layer 142, and the third insulating layer 160 further include the contact holes 1063, 2063, 3063, and 4063 disposed on the drain regions 1137c_1, 2137c_1, 3137c_1, and 4137c_1 of the first sub-transistors 1T3_1, 2T3_1, 3T3_1, and 4T3_1 of the third transistors 1T3, 2T3, 3T3, and 4T3, and the contact holes 12063 and 34063 disposed on the drain regions 12137d_1 and 34137d_1 of the first sub-transistors 12T4_1 and 34T4_1 of the fourth transistor 12T4 and 34T4. The first insulating layer 141, the second insulating layer 142, and the third insulating layer 160 further include the contact holes 12064 and 34064 disposed on the initialization voltage line 159. The first insulating layer 141, the second insulating layer 142, and the third insulating layer 160 further include the contact holes 12065 and 34065 disposed on the source regions 12136d_2 and 34136d_2 of the second sub-transistors 12T4_2 and 34T4_2 of the fourth transistors 12T4 and 34T4 or the drain regions 12137g and 34137g of the seventh transistors 12T7 and 34T7. The first insulating layer 141, the second insulating layer 142, and the third insulating layer 160 further include the contact holes 13067 and 24067 disposed on the source regions 1136e, 2136e, 3136e, and 4136e of the fifth transistors 1T5, 2T5, 3T5, and 4T5, the contact holes 1068 and 2068 disposed on the first and second storage lines 156a and 156b, and the contact holes 1069, 2069, 3069, and 4069 disposed on the drain regions 1137f, 2137f, 3137f, and 4137f of the sixth transistors 1T6, 2T6, 3T6, and 4T6.

The above-described third conductive layer may be disposed on the third insulating layer 160. The third conductive layer may include metals such as, for example, copper (Cu), aluminum (Al), molybdenum (Mo), and alloys thereof.

The extensions 1157, 2157, 3157, and 4157 of the first and second storage lines 156a and 156b overlap the driving gate electrodes 1155a, 2155a, 3155a, and 4155a via the second insulating layer 142, thereby forming the capacitors Cst1, Cst2, Cst3, and Cst4.

A passivation layer 180 may be disposed on the third conductive layer and the third insulating layer 160. The passivation layer 180 may include an organic material such as, for example, a polyacryl-based resin (polyacrylic resin), a polyimide-based resin (polyimide resin), etc. An upper surface of the passivation layer 180 may be substantially flat.

The passivation layer 180 may include the contact holes 1089, 2089, 3089, and 4089 disposed on the connecting members 12179 and 34179.

The above-described fourth conductive layer may be disposed on the passivation layer 180.

A pixel definition layer 350 may be disposed on the passivation layer 180 and the fourth conductive layer. The pixel definition layer 350 has an opening 351 disposed on the pixel electrodes 1191, 2191, 3191, and 4191.

An emission layer 370 is disposed on the pixel electrodes 1191, 2191, 3191, and 4191 of each of the pixels PX1, PX2, PX3, and PX4. The emission layer 370 may be disposed within the opening 351. The emission layer 370 may include, for example, an organic light emission material or an inorganic light emission material.

A common electrode 270 is disposed on the emission layer 370. The common electrode 270 is also formed on the pixel definition layer 350, thereby extending throughout the plurality of pixels.

The pixel electrodes 1191, 2191, 3191, and 4191, the emission layer 370, and the common electrode 270 together form the light emitting diodes (LED) ED1, ED2, ED3, and ED4.

An encapsulation layer protecting the light emitting diodes (LED) ED1, ED2, ED3, and ED4 may be disposed on the common electrode 270. The encapsulation layer may include an inorganic layer and an organic layer that are alternately stacked.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A display device, comprising:
a plurality of pixels, wherein each of the plurality of pixels comprises:
  a first transistor comprising a first gate electrode, a first source region, and a first drain region;
  a second transistor connected to the first source region of the first transistor;
  a third transistor connected to the first gate electrode and the first drain region of the first transistor;
  a fifth transistor connected to the first source region of the first transistor;
  a sixth transistor connected to the first drain region of the first transistor; and
  a light-emitting diode connected to the sixth transistor,
wherein the plurality of pixels comprises a first pixel and a second pixel disposed adjacent to each other,
wherein the first and second pixels share a fourth transistor connected to the third transistor of the first pixel and the third transistor of the second pixel, and share a seventh transistor connected between the sixth transistor and the light-emitting diode of the first pixel, and connected between the sixth transistor and the light-emitting diode of the second pixel.

2. The display device of claim 1, further comprising:
a first scan line connected to the second transistor and the third transistor of the first pixel;
a second scan line connected to the fourth transistor and the seventh transistor of the first pixel and the second pixel; and
a third scan line connected to the second transistor and the third transistor of the second pixel.

3. The display device of claim 2, further comprising:
an initialization voltage line connected to the fourth transistor and the seventh transistor of the first pixel and the second pixel.

4. The display device of claim 3, wherein the fourth transistor of the first pixel and the second pixel comprises:
a fourth gate electrode connected to the second scan line, a fourth source electrode connected to the initialization voltage line, and a fourth drain region connected to the first transistor and the third transistor of the first pixel and the first transistor and the third transistor of the second pixel.

5. The display device of claim 3, wherein the seventh transistor of the first pixel and the second pixel comprises:
a seventh gate electrode connected to the second scan line, a seventh source region connected to the sixth transistor of the first pixel and the sixth transistor of the second pixel, and a seventh drain region connected to the initialization voltage line.

6. The display device of claim 1, further comprising:
a connecting member connecting the first transistor of the first pixel and the third transistor of the first pixel.

7. The display device of claim 6, wherein:
the third transistor of the first pixel comprises a third gate electrode, a third source region, and a third drain region; and
the connecting member connects the first gate electrode of the first transistor of the first pixel and the third drain region of the third transistor of the first pixel.

8. The display device of claim 6, wherein the third transistor of the first pixel and the fourth transistor of the first pixel and the second pixel are directly connected.

9. The display device of claim 1, further comprising:
a connecting member connecting the first transistor of the second pixel, the third transistor of the second pixel, and the fourth transistor of the first pixel and the second pixel.

10. The display device of claim 9, wherein:
the third transistor of the second pixel comprises a third gate electrode, a third source region, and a third drain region; and
the connecting member connects the first gate electrode of the first transistor of the second pixel and the third drain region of the third transistor of the second pixel.

11. The display device of claim 10, wherein:
the fourth transistor of the first pixel and the second pixel comprises a fourth gate electrode, a fourth source region, and a fourth drain region; and
the connecting member connects the third drain region of the third transistor of the second pixel and the fourth drain region of the fourth transistor of the first pixel and the second pixel.

12. The display device of claim 1, further comprising:
a connecting member connecting the sixth transistor of the first pixel, the sixth transistor of the second pixel, and the seventh transistor of the first pixel and the second pixel.

13. The display device of claim 12, wherein:
the sixth transistor of the first pixel comprises a sixth gate electrode, a sixth source region, and a sixth drain region;
the seventh transistor of the first pixel and the second pixel comprises a seventh gate electrode, a seventh source region, and a seventh drain region; and
the connecting member connects the sixth drain region of the sixth transistor of the first pixel and the seventh source region of the seventh transistor of the first pixel and the second pixel.

14. The display device of claim 13, wherein:
the sixth transistor of the second pixel comprises a sixth gate electrode, a sixth source region, and a sixth drain region; and
the connecting member connects the sixth drain region of the sixth transistor of the second pixel and the seventh source region of the seventh transistor of the first pixel and the second pixel.

15. The display device of claim 1, wherein the first pixel and the second pixel are adjacent to each other in a first direction, and the plurality of pixels further comprises:
a third pixel adjacent to the first pixel in a second direction; and
a fourth pixel adjacent to the third pixel in the first direction,
wherein the second direction is different from the first direction.

16. The display device of claim 15, wherein the second direction is substantially perpendicular to the first direction, and the fourth pixel is adjacent to the second pixel in the second direction.

17. The display device of claim 15, further comprising:
a driving voltage line disposed between the first pixel and the third pixel and between the second pixel and the fourth pixel,
wherein the fifth transistor of the first pixel, the fifth transistor of the second pixel, the fifth transistor of the third pixel, and the fifth transistor of the fourth pixel are connected to the driving voltage line.

18. The display device of claim 17, further comprising:
a first data line connected to the second transistor of the first pixel and the second transistor of the second pixel; and
a second data line connected to the second transistor of the third pixel and the second transistor of the fourth pixel.

19. The display device of claim 18, wherein the driving voltage line is disposed between the first data line and the second data line.

20. The display device of claim 15, wherein the third pixel and the fourth pixel share a fourth transistor connected to the third transistor of the third pixel and the third transistor of the fourth pixel, and share a seventh transistor connected to the sixth transistor of the third pixel and the sixth transistor of the fourth pixel.

21. A display device, comprising:
a plurality of pixels, wherein each of the plurality of pixels comprises:
a first transistor comprising a first gate electrode, a first source region, a first channel region, and a first drain region;
a sixth transistor connected to the first drain region of the first transistor and comprising a sixth channel region; and
a light-emitting diode connected to the sixth transistor,
wherein the plurality of pixels comprises a first pixel and a second pixel disposed adjacent to each other in a first direction, a third pixel disposed adjacent to the first pixel in a second direction, and a fourth pixel disposed adjacent to the second pixel in the second direction,
wherein the first direction and the second direction are different,
wherein the first channel region has a bent shape, the first channel region of the first pixel and the first channel region of the second pixel are symmetrical to each other with respect to a first imaginary line parallel with the second direction, and the first channel region of the first pixel and the first channel region of the third pixel are symmetrical to each other with respect to a second imaginary line parallel with the first direction, wherein the first and second pixels share a seventh transistor connected between the sixth transistor and the light-emitting diode of the first pixel, and connected between the sixth transistor and the light-emitting diode of the second pixel.

22. The display device of claim 21, wherein each of the plurality of pixels further comprises:

a second transistor connected to the first source region of the first transistor and comprising a second channel region;

a third transistor connected to the first gate electrode and the first drain region of the first transistor and comprising a third channel region; and a fifth transistor connected to the first source region of the first transistor and comprising a fifth channel region, wherein the second channel region, the third channel region, the fifth channel region, and the sixth channel region of the first pixel and the second channel region, the third channel region, the fifth channel region, and the sixth channel region of the second pixel are symmetrical to each other with respect to the first imaginary line parallel with the second direction, wherein the second channel region, the third channel region, the fifth channel region, and the sixth channel region of the first pixel and the second channel region, the third channel region, the fifth channel region, and the sixth channel region of the third pixel are symmetrical to each other with respect to the second imaginary line parallel with the first direction.

23. The display device of claim 22, wherein the second direction is substantially perpendicular to the first direction, and the fourth pixel is adjacent to the second pixel in the second direction.

24. The display device of claim 23, wherein the first channel region, the second channel region, the third channel region, the fifth channel region, and the sixth channel region of the fourth pixel and the first channel region, the second channel region, the third channel region, the fifth channel region, and the sixth channel region of the second pixel are symmetrical to each other with respect to the second imaginary line parallel with the first direction.

25. The display device of claim 24, wherein the first pixel and the second pixel comprise a fourth transistor connected to the third transistor of the first pixel and the third transistor of the second pixel.

* * * * *